(12) United States Patent
Nino

(10) Patent No.: US 11,477,888 B2
(45) Date of Patent: *Oct. 18, 2022

(54) PRINTED MULTIFUNCTIONAL SKIN FOR AERODYNAMIC STRUCTURES AND ASSOCIATED SYSTEMS AND METHODS

(71) Applicant: Quest Integrated, LLC, Kent, WA (US)

(72) Inventor: Giovanni Nino, Issaquah, WA (US)

(73) Assignee: Quest Integrated, LLC, Renton, WA (US)

( * ) Notice: Subject to any disclaimer, the term of this patent is extended or adjusted under 35 U.S.C. 154(b) by 1007 days.

This patent is subject to a terminal disclaimer.

(21) Appl. No.: 16/154,509

(22) Filed: Oct. 8, 2018

(65) Prior Publication Data

US 2020/0113054 A1  Apr. 9, 2020

(51) Int. Cl.
*B29C 67/00* (2017.01)
*G01B 7/16* (2006.01)
(Continued)

(52) U.S. Cl.
CPC ............... *H05K 1/16* (2013.01); *B64C 1/12* (2013.01); *B64C 3/26* (2013.01); *B64C 39/024* (2013.01);
(Continued)

(58) Field of Classification Search
CPC ....... B64C 39/024; B64C 13/16; B64C 11/18; B64C 3/26; G01B 7/18; G06F 13/4282;
(Continued)

(56) References Cited

U.S. PATENT DOCUMENTS 6,986,287 B1 * 1/2006 Dorfman .................. G01B 7/18
8,766,108 B2 * 7/2014 Bunyan .................. H02G 13/00
174/355
(Continued)

FOREIGN PATENT DOCUMENTS

DE     196 05 050 C1    4/1997
DE     19605050 C1 *   4/1997 ............. H01L 41/16
(Continued)

OTHER PUBLICATIONS

Glaessgen, E.H., and D.S. Stargel, "The Digital Twin Paradigm for Future NASA and U.S. Air Force Vehicles," American Institute of Aeronautics and Astronautics 53rd Structures, Structural Dynamics, and Materials Conference: Special Session on the Digital Twin, Honolulu, Apr. 23-26, 2012, pp. 1-14.
(Continued)

*Primary Examiner* — Yuri Kan
(74) *Attorney, Agent, or Firm* — Christensen O'Connor Johnson Kindness PLLC

(57) ABSTRACT

Systems and methods for printed multifunctional skins are disclosed herein. In one embodiment, an aerodynamic apparatus includes an aerodynamic structure having a first surface exposed to an outside environment, and a second surface exposed to an inside environment. A printed sensor is carried by the first surface of the aerodynamic structure, electronic components are carried by the second surface of the aerodynamic structure, and at least one printed conductive trace is carried by the first surface and the second surface. The printed conductive trace electrically connects the printed sensor with the electronics.

21 Claims, 25 Drawing Sheets

(51) Int. Cl.
    *B64D 45/02*  (2006.01)
    *H05K 1/16*   (2006.01)
    *B64D 45/00*  (2006.01)
    *B64C 39/02*  (2006.01)
    *B64C 3/26*   (2006.01)
    *B64C 1/12*   (2006.01)

(52) U.S. Cl.
    CPC ...... *B64D 45/00* (2013.01); *B64D 2045/0085* (2013.01); *H05K 2201/10151* (2013.01); *Y10S 439/91* (2013.01)

(58) Field of Classification Search
    CPC ........ G06F 3/016; H02J 7/0091; B64D 11/00; B64D 45/00; B64D 15/12; B64D 45/02; A61B 5/4561; B23K 15/0086; H01L 41/16; C25D 5/02; G01M 5/0066; H02H 3/22; H05F 3/00; H05K 9/00; B29C 67/00; B29C 64/112; B29C 70/882
    See application file for complete search history.

(56) References Cited

U.S. PATENT DOCUMENTS

| | | | | |
|---|---|---|---|---|
| 9,643,734 | B2* | 5/2017 | Burgess | B64D 45/02 |
| 10,155,373 | B2* | 12/2018 | Nino | B29C 64/112 |
| 2004/0069895 | A1* | 4/2004 | Pham | B64D 45/02 244/1 A |
| 2006/0237585 | A1* | 10/2006 | Lau | B64D 11/00 |
| 2007/0217116 | A1* | 9/2007 | Murcianos | B64D 39/04 361/220 |
| 2009/0124299 | A1* | 5/2009 | Suzuki | H02J 7/0091 |
| 2009/0182515 | A1* | 7/2009 | Pado et al. | G01M 5/0066 |
| 2009/0182525 | A1 | 7/2009 | Pado et al. | |
| 2010/0288882 | A1* | 11/2010 | Olson | B64D 15/163 244/134 D |
| 2011/0141645 | A1* | 6/2011 | Le Louarn | B64D 45/02 361/117 |
| 2011/0203937 | A1* | 8/2011 | Sidhu | C25D 5/02 |
| 2011/0272531 | A1* | 11/2011 | Minick | B64C 11/18 |
| 2014/0139436 | A1* | 5/2014 | Ramstein | G06F 3/016 |
| 2014/0332620 | A1* | 11/2014 | Earon | B64C 39/024 |
| 2016/0061381 | A1* | 3/2016 | Kotliar | B23K 15/0086 |
| 2016/0096330 | A1* | 4/2016 | Trowbridge | B33Y 10/00 264/104 |
| 2016/0200420 | A1* | 7/2016 | McKenna | B64C 13/16 |
| 2016/0310064 | A1* | 10/2016 | Cheng | A61B 5/4561 |

FOREIGN PATENT DOCUMENTS

| | | | | |
|---|---|---|---|---|
| DE | | 2402830 A1 * | 1/2012 | ........ G06F 13/4282 |
| EP | | 2 402 830 A1 | 1/2012 | |

OTHER PUBLICATIONS

Hon, K.K.B., et al., "Direct Writing Technology—Advances and Developments," CIRP Annals—Manufacturing Technology 57(2):601-620, 2008.

Notice of Allowance dated Nov. 20, 2018, from U.S. Appl. No. 15/295,702, filed Oct. 17, 2016, now U.S. Pat. No. 10,155,373, which is a continuation of the present application, 5 pages.

PST Sensors, "PST Technology," <http://www.pstsensors.com/pst-technology> [retrieved Sep. 5, 2015], 2 pages.

Sensitronics, "FSR 101: Sensor Theory," <http://www.sensitronics.com/fsr101.htm> [retrieved Sep. 5, 2015], 4 pages.

* cited by examiner

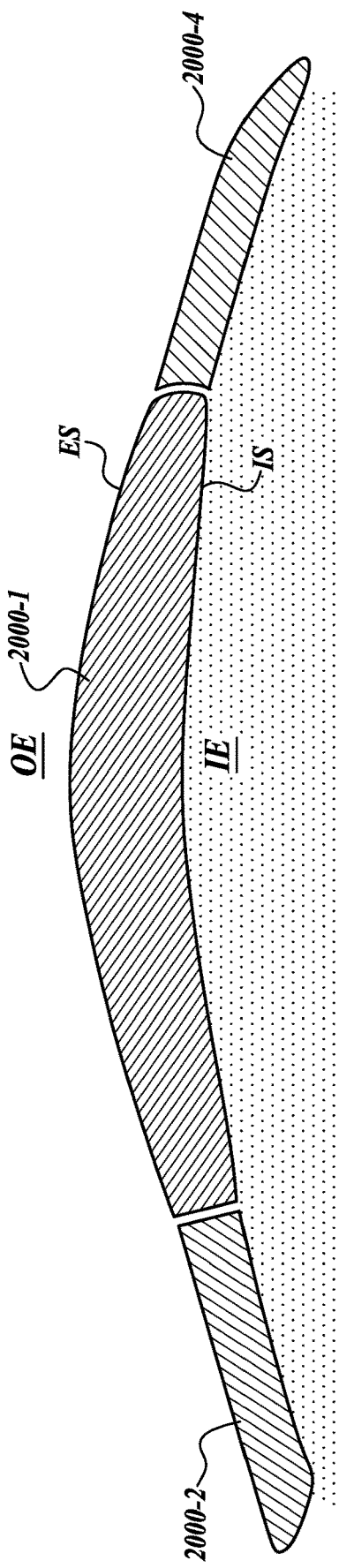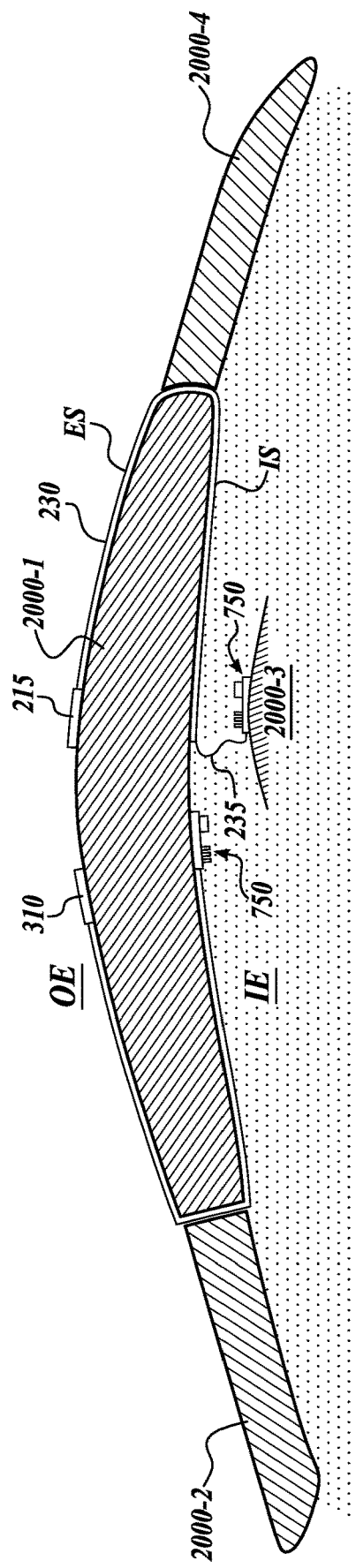
FIG. 12A
FIG. 12B

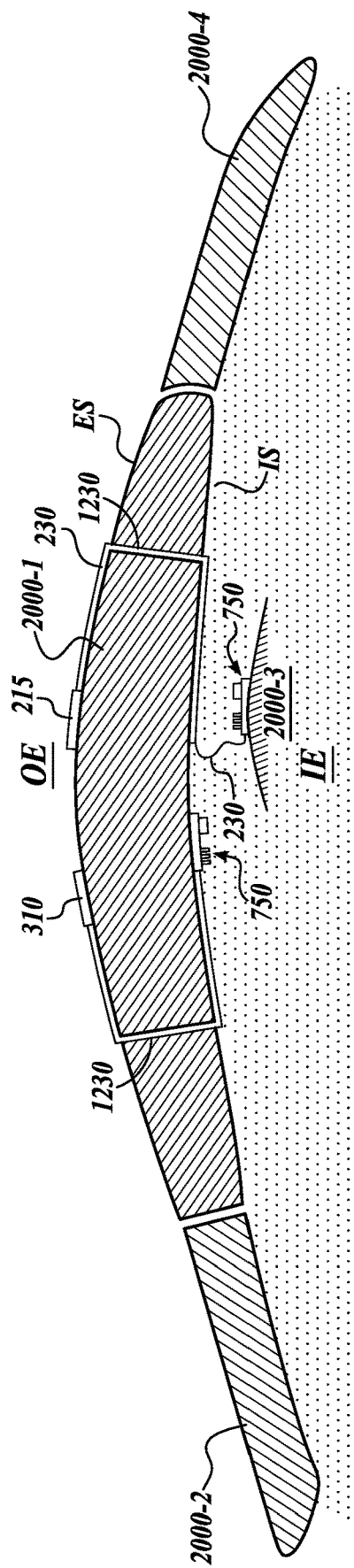

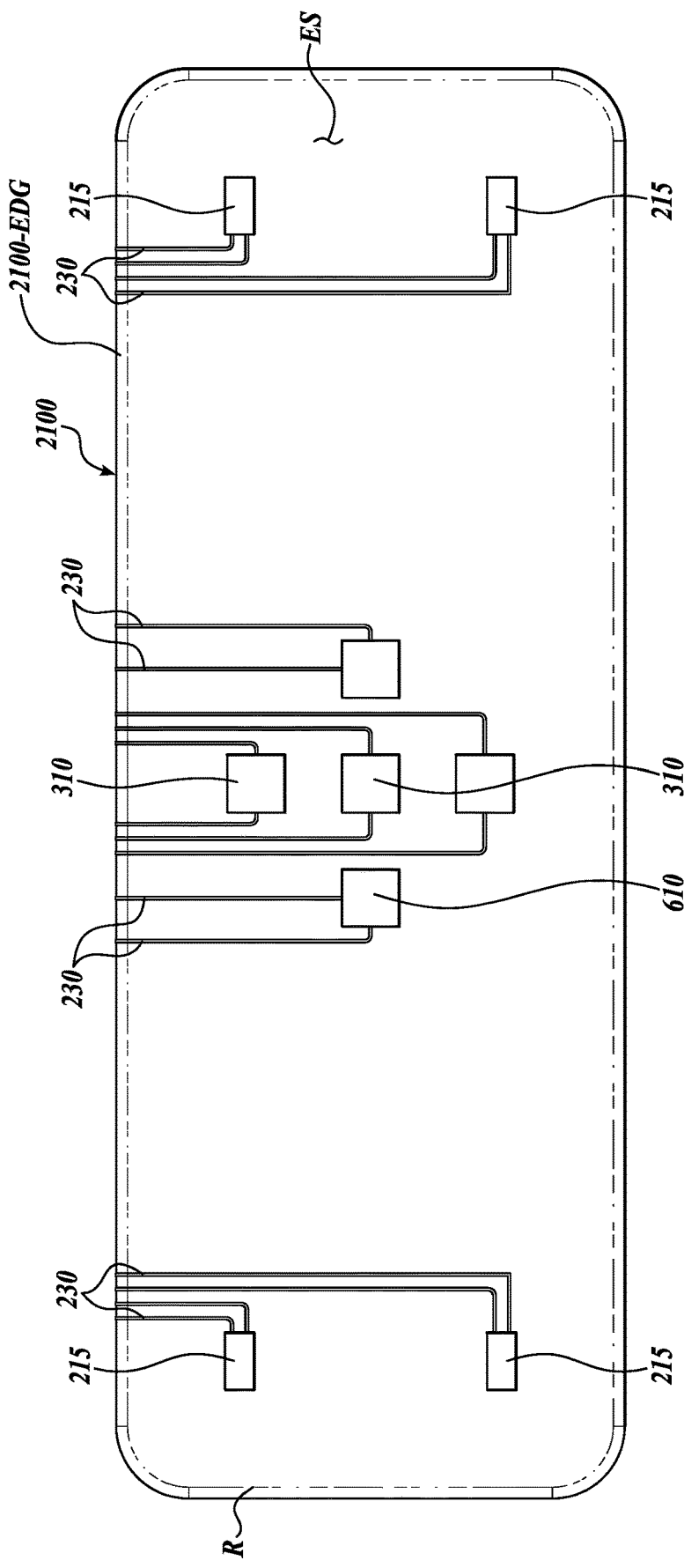

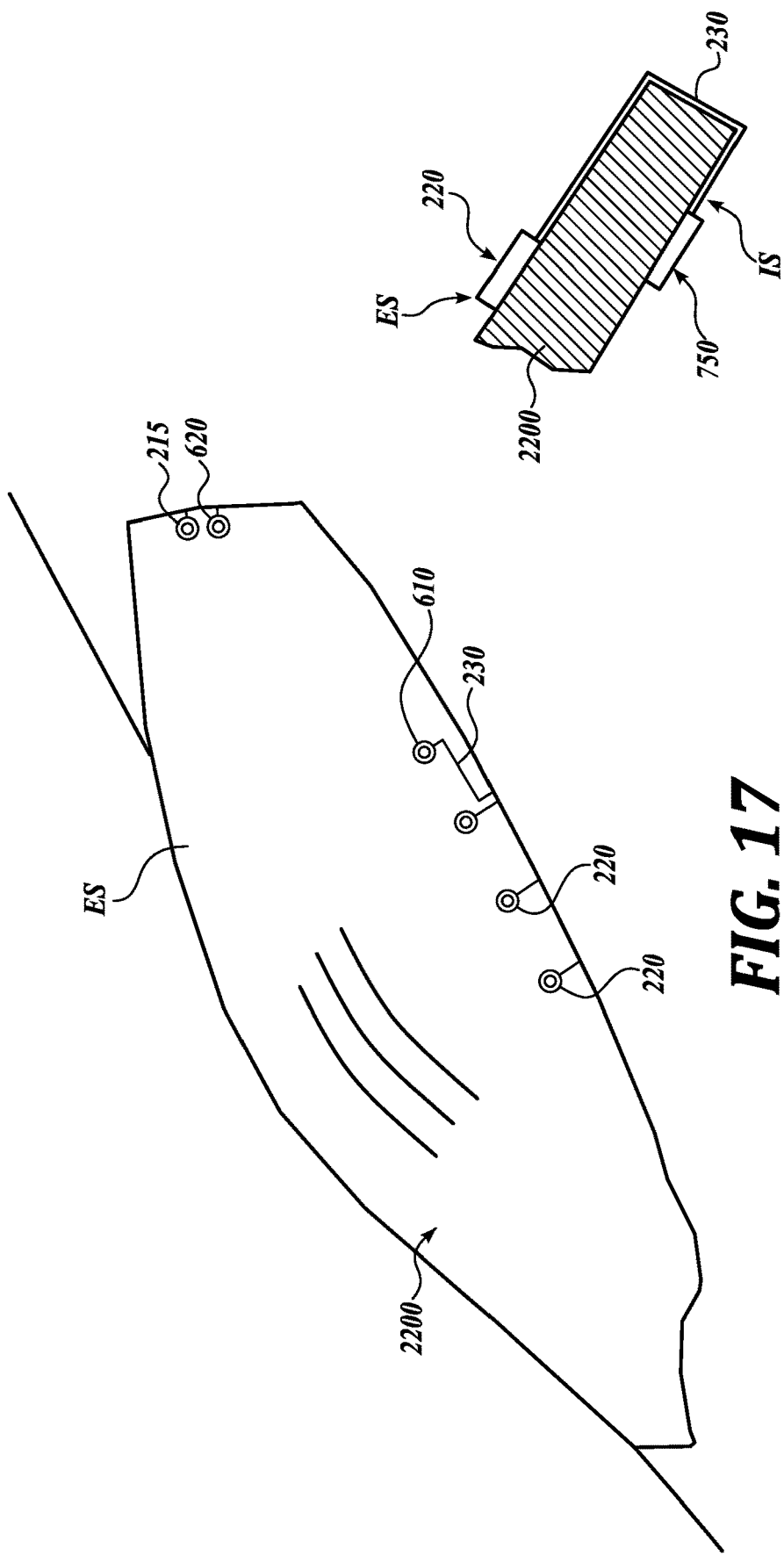

PRINTED MULTIFUNCTIONAL SKIN FOR AERODYNAMIC STRUCTURES AND ASSOCIATED SYSTEMS AND METHODS

STATEMENT OF GOVERNMENT LICENSE RIGHTS

This invention was made with Government support under contract Nos. FA9550-15-C-0007 and FA9550-16-C-0024 awarded by the U.S. Air Force Research Laboratory—Office of Scientific Research. The Government has certain rights in the invention.

FIELD OF THE INVENTION

The present invention relates generally to sensors and actuators attached to the structures, including aircraft.

BACKGROUND

Conventional aircrafts may carry large numbers of sensors and actuators. For example, the aircrafts are typically equipped with instruments that can measure outside temperature, speed of the aircraft, outside/inside pressure, humidity, weight of the aircraft, etc. Some measurement sensors (e.g., inside humidity and temperature) and most of the supporting electronics are typically installed inside the aircraft. On the other hand, other measurement sensors typically protrude outside of the aircraft (e.g., pitot tube for the pressure/speed measurements). Additionally, the aircrafts also carry actuators (e.g., for landing gear deployment and retraction, for wing flaps, ice protection systems, etc.). These actuators are generally bulky and, when not exercised, are typically concealed within the aircraft. Some other sensing/actuation aerospace systems perform monitoring for the structures, ice protection, thermal management, vibration damping, etc.

However, the available space for the instruments and their supporting electronics is generally reduced in the newer, smaller aircraft. For example, small drones may not have enough space to carry all the actuators and sensors, and the supporting electronics. Similar problems exist with the newer manned aircraft, because those are also smaller at least in part due to stronger materials used for these aircraft that, in turn, enable smaller aircraft.

Furthermore, additional instruments/sensors may measure, for example, loading of the aircraft structure, especially during the development of the aircraft (Testing and Evaluation or T&E). For example, strain sensors may be mounted on the load bearing parts of the aircraft structure during the testing of the aircraft, but the production aircraft would not include these strain sensors. Existing methods for assessment/management of the structural health, certification of flight readiness and fleet management are largely based on statistical data about the history of the aircraft, and depend heavily on the expertise of mechanics and engineers. Accordingly, there remains a need for the sensors and actuators that are compact, light, and inexpensive, and that can be used for the manned and unmanned aircraft.

DESCRIPTION OF THE DRAWINGS

The foregoing aspects and many of the attendant advantages of the inventive technology will become more readily appreciated as the same become better understood by reference to the following detailed description, when taken in conjunction with the accompanying drawings, wherein:

FIGS. 12A-12C are cross-sectional views of the aerodynamic structures in accordance with an embodiment of the presently disclosed technology.

FIGS. 14A and 14B plan front and plan back views of the aerodynamic structure shown in FIG. 14.

FIG. 17 is an isometric view of a canopy in accordance with an embodiment of the presently disclosed technology.

FIG. 17A is a cross-sectional view of the canopy shown in FIG. 17.

DETAILED DESCRIPTION

Figure 1:
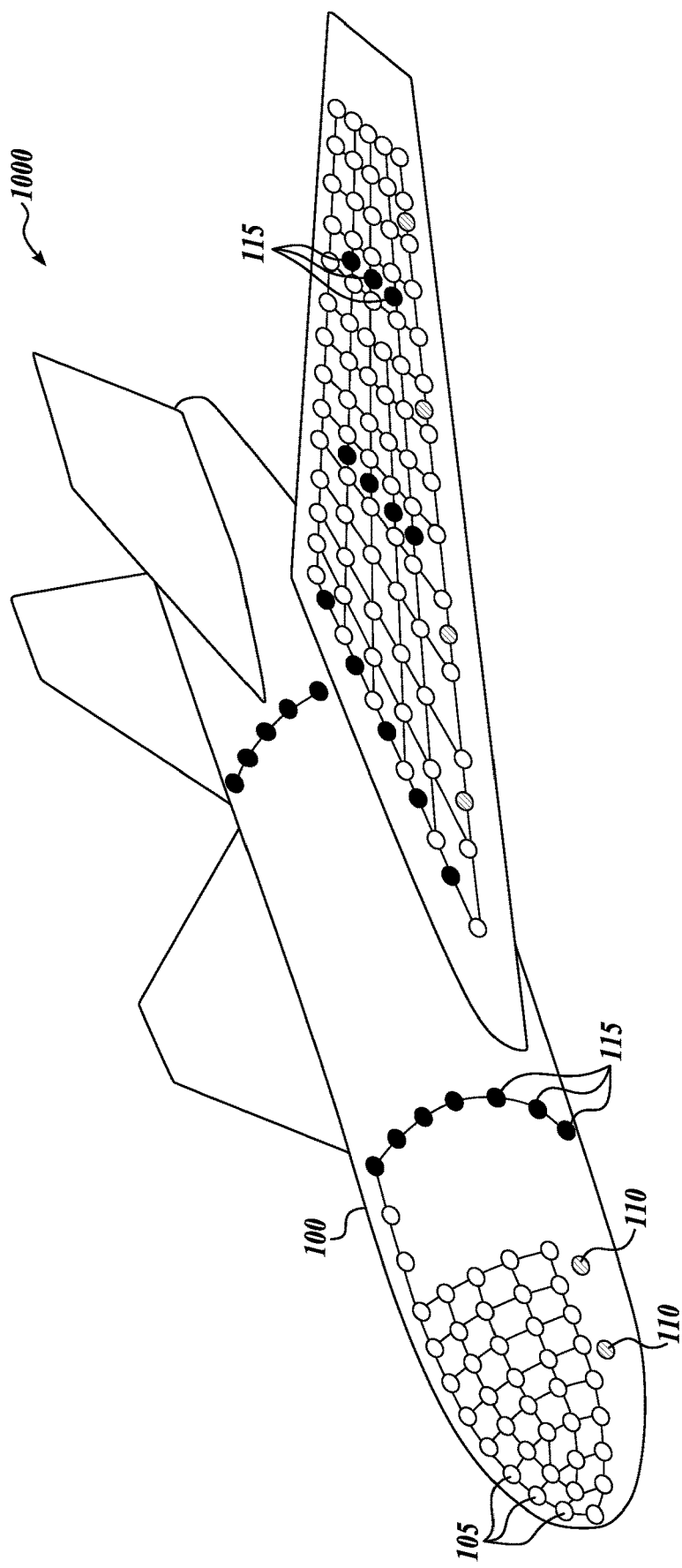
FIG. 1 is a schematic view of an aircraft equipped with sensors in accordance with an embodiment of the presently disclosed technology.

Specific details of several embodiments of representative sensors and actuators carried by aircraft, and associated methods of manufacturing and use are described below. The system and methods can be used for equipping the aircraft or an aerodynamic structure with the sensors, actuators, and the supporting electronics (also referred to as printed multifunctional skin (pSKIN) or instrumentation), and for using the instrumentation for developing, testing and using the aircraft or the aerodynamic structure.

In at least some embodiments, the sensors (pressure sensors, temperature sensors, strain sensors, ice sensors, strain transducers, RF antennas, etc.) and actuators (e.g., heaters, ionic actuators, plasma actuators, miniature air blowers, etc.) may be built using 3D printing (also referred to as 3D manufacturing, additive printing, additive manufacturing, or direct write). The sensors and actuators may be printed directly over the aircraft structures or inside relatively shallow cavities of the aircraft structures. In some embodiments, the host aircraft structures can also be made by 3D printing.

Furthermore, in at least some embodiments, the electronics may also be printed using specialized 3D printing equipment, methods and materials or "inks" (e.g., conductors, semiconductors, and dielectrics). Some examples of 3D-printed electronic elements or components are interconnects, electrodes, resistors, capacitors, and active electronics. As a result, a multifunctional, smart and lightweight device can be created.

In many embodiments, a relatively high density of sensors/actuators at a reduced unit cost/weight is advantageous over the bulky legacy systems. For example, many sensors/actuators and their supporting electronics (e.g., microcontrollers, op-amps, analog to digital (A/D) converters, resistors, power supplies, etc.) can be 3D-manufactured at the outer surface of the aircraft structure in conjunction with the manufacturing of the aircraft structure itself (as opposed to placing the conventional sensors/actuators/electronics deeper inside the aircraft structure with the conventional technology). In some embodiments, one or more relatively shallow openings (e.g., 2-10 millimeter deep) in the aircraft structure may house power supplies, electronics, connectors, etc., for the sensors/actuators. Because of their relatively low height, the sensors/actuators closely approximate the surface of the aircraft structure, therefore not impeding or disturbing the airflow around the aircraft structure. In some embodiments, the sensors/actuators may be 3D-printed directly over the outer surface of the aircraft structure in conjunction with manufacturing of the aircraft structure itself, or after the aircraft structure has been already manufactured.

In some embodiments of the inventive technology, the sensors/actuators, and the electronics may be printable onto a conforming foil (e.g., a decal, also referred to as pSKIN) that is subsequently transferred to an existing aircraft structure. In some embodiments, the conforming foils may have thickness of several micrometers (e.g., less than 100 μm, or 5 μm-100 μm) to several millimeters (e.g., 2-10 mm).

Data from the 3D-printed sensors may provide an assessment of the state of the aircraft and/or an improved modeling (e.g., numerical simulation) of performance over time, therefore resulting in improved monitoring of the structure and better prediction of maintenance needs. In some embodiments, the inventive technology can enable a "Digital Twin," which is a mirror computer model of the aircraft that integrates numerical simulation with data from aircraft sensors (e.g., 3D-printed sensors), the aircraft maintenance history, and historical statistical data across aircraft of the same type to enable improved safety and reliability. In some embodiments, the Digital Twin may be used to improve the models of the aircraft.

In some embodiments, the above-described methods and systems may be applied to other structures, e.g., pumps, wind turbines, submarines, ships, engines, blades, prosthetics, pipelines, etc. For example, a vane of an air fan may be equipped with 3D-manufactured sensors/actuators (a pSKIN) at an outer surface of the vane for monitoring or optimization of the air fan's performance.

In some aerodynamic structures, the sensors, actuators, antennae, transducers, interconnects and other devices and elements of the pSKIN are exposed to the outside environment, while the electronics that supports these components of the pSKIN is disposed on the inner sides of the aircraft structure. As a result, the electronics may be better protected against the environmental effects (e.g., temperature extremes, moisture, pressure extremes, etc.). In some embodiments, the traces connecting the printed devices or printed elements (sensors, actuators, transducers, pads, antennae, capacitors, resistors, inductors, batteries, logic circuits, memory, etc.) with the supporting electronics are partially run through the vias in the aerodynamic structure. In some embodiments, the traces are routed around the edges of the aerodynamic structures (e.g., aircraft panels, canopies, windows, etc.) that carry the pSKIN. The edges may be rounded to reduce strain on the traces and improve their reliability.

FIG. 1 is a schematic view of an aircraft 1000 equipped with sensors in accordance with an embodiment of the presently disclosed technology. The aircraft 1000 can carry 3D-printed pressure sensors 105, temperature sensors 110, and/or strain sensors 115. These sensors may send their measurement data to a local or a central processing/display unit (e.g., a display in the airplane cockpit, computer carried by an unmanned vehicle, etc.). Other numbers and types of sensors are also possible. In some embodiments, the aircraft 1000 may also carry 3D-printed actuators.

Figure 2:
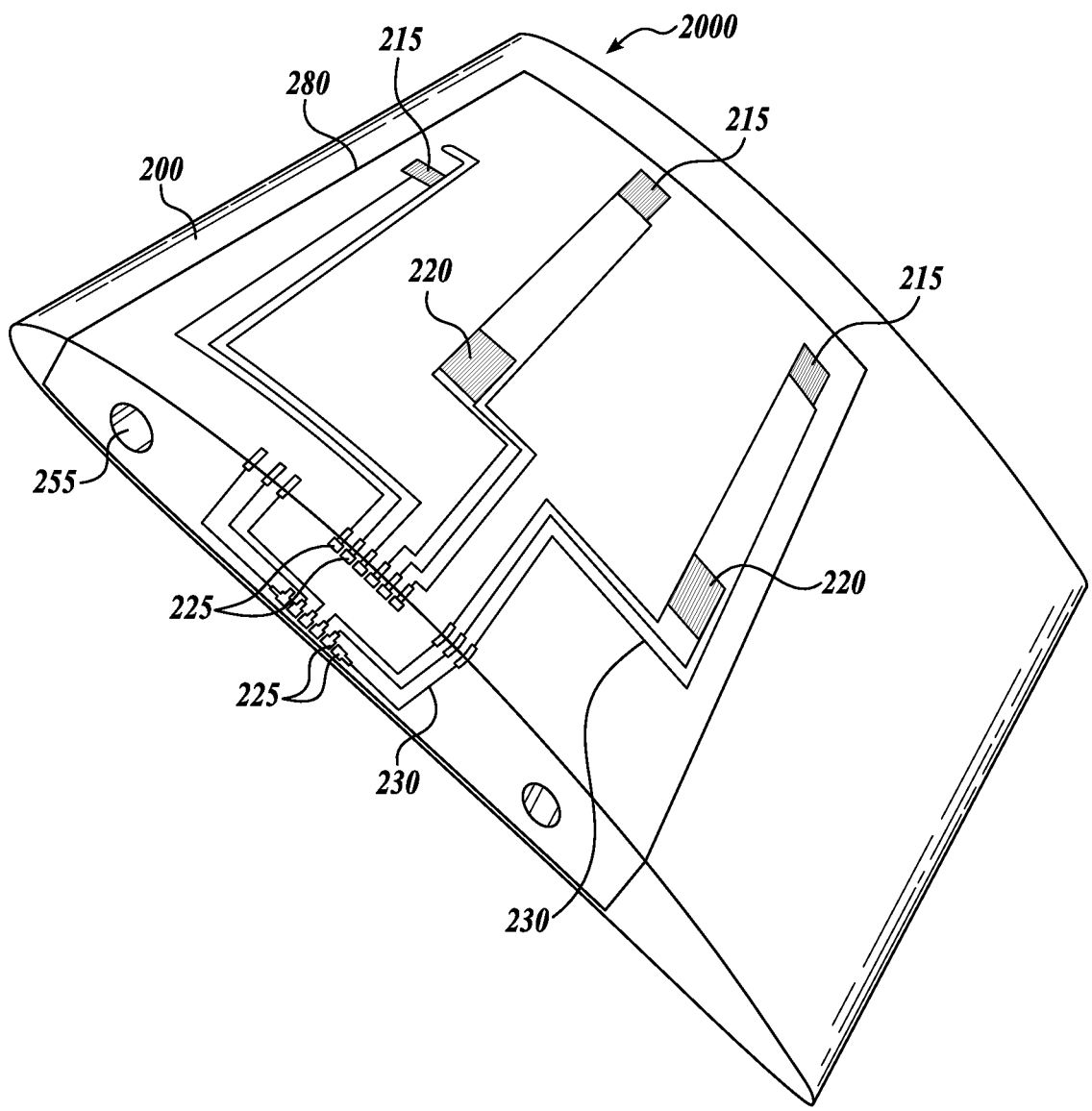
FIG. 2 is an isometric view of an aircraft structure equipped with sensors and actuators in accordance with an embodiment of the presently disclosed technology.

FIG. 2 is an isometric view of an aircraft structure 200 equipped with sensors and actuators in accordance with an embodiment of the presently disclosed technology. The illustrated aircraft structure 200 may be, for example, a segment of an aircraft wing. In some embodiments, the aircraft structure 200 can include openings 255 for connecting with the adjacent aircraft structures. The aircraft structure 200 carries a decal (pSKIN) 280. The combination of the pSKIN 280 and the aircraft structure 200 may be referred to as a smart structure or a smart device 2000. The illustrated pSKIN 280 includes sensors 215 (e.g., strain sensors or strain gauges) and actuators 220 (e.g., heaters), but other sensors/actuators are also possible. The sensors 215 and actuators 220 are connected with conductive traces 230 to the connectors 225 (e.g., metal pads or plugs). In at least some embodiments, the supporting electronics (not shown) may be connected through the connectors 225 to the sensors/actuators 215/220. In some embodiments, the supporting electronics may be at least partially embodied in the pSKIN 280. Generally, the pSKIN 280 remains flexible because of its relatively small thickness (e.g., less than 10 μm to few mm). As a result, the pSKIN 280 may follow the shape of the aircraft structure 200, and may be folded over the edges of the aircraft structure 200. The pSKIN 280 can also be directly printed over the aircraft structure 200.

Figure 3:
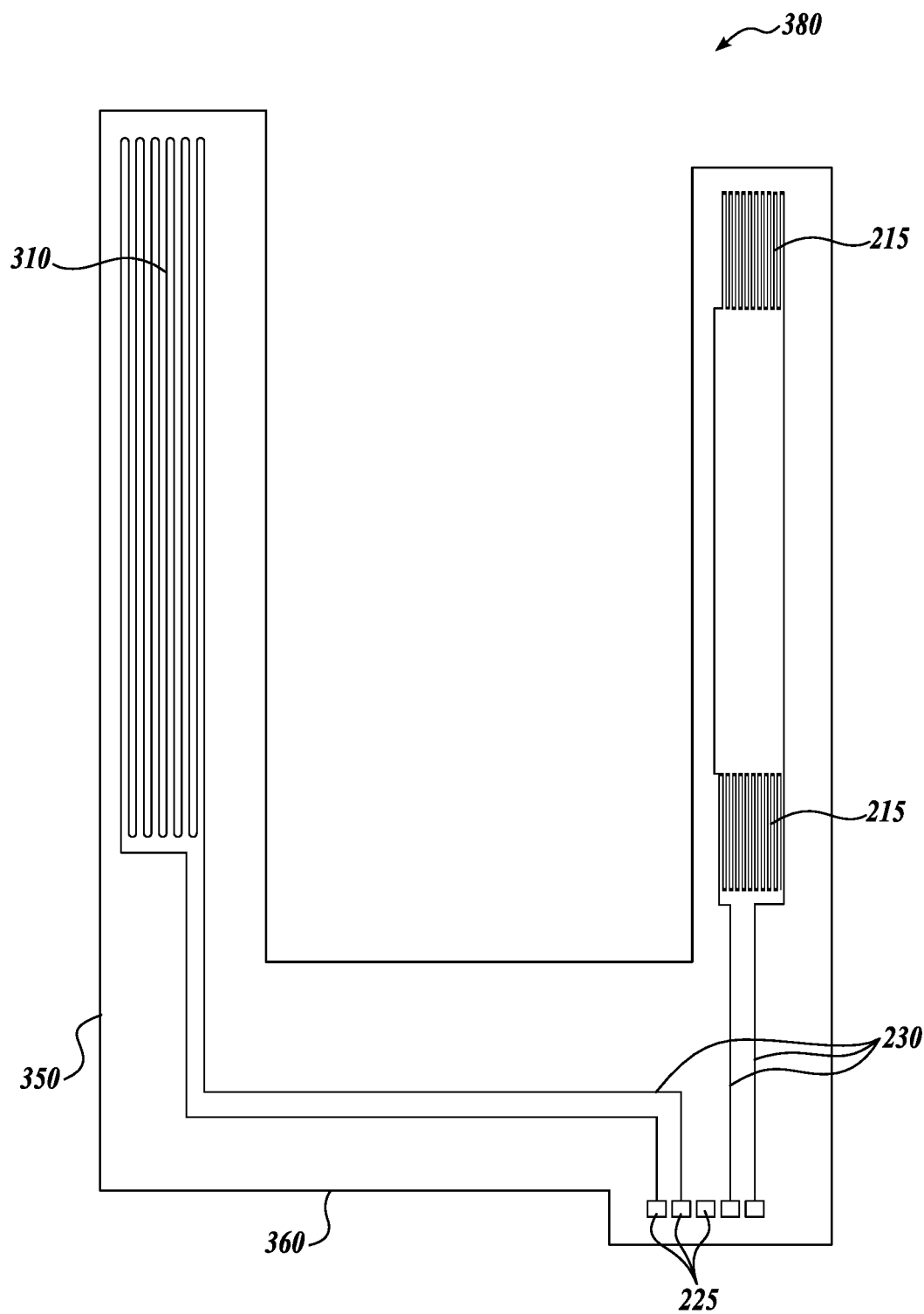
FIG. 3 is a top plan view of a printed multifunctional skin (pSKIN) equipped with sensors and actuators in accordance with an embodiment of the presently disclosed technology.

FIG. 3 is a top plan view of a pSKIN 380 with sensors and actuators in accordance with an embodiment of the presently disclosed technology. In the illustrated embodiment, the pSKIN 380 includes sensors 215 (e.g., for temperature measurements), and an actuator 310 (e.g., a heater). In other embodiments, the pSKIN 380 may include different type and number of sensors/actuators and supporting electronics, only sensors, or only actuators. The sensors 215 and the actuator 310 are connected with conductive traces (e.g., metal traces) with the connectors 225.

Figure 4A:
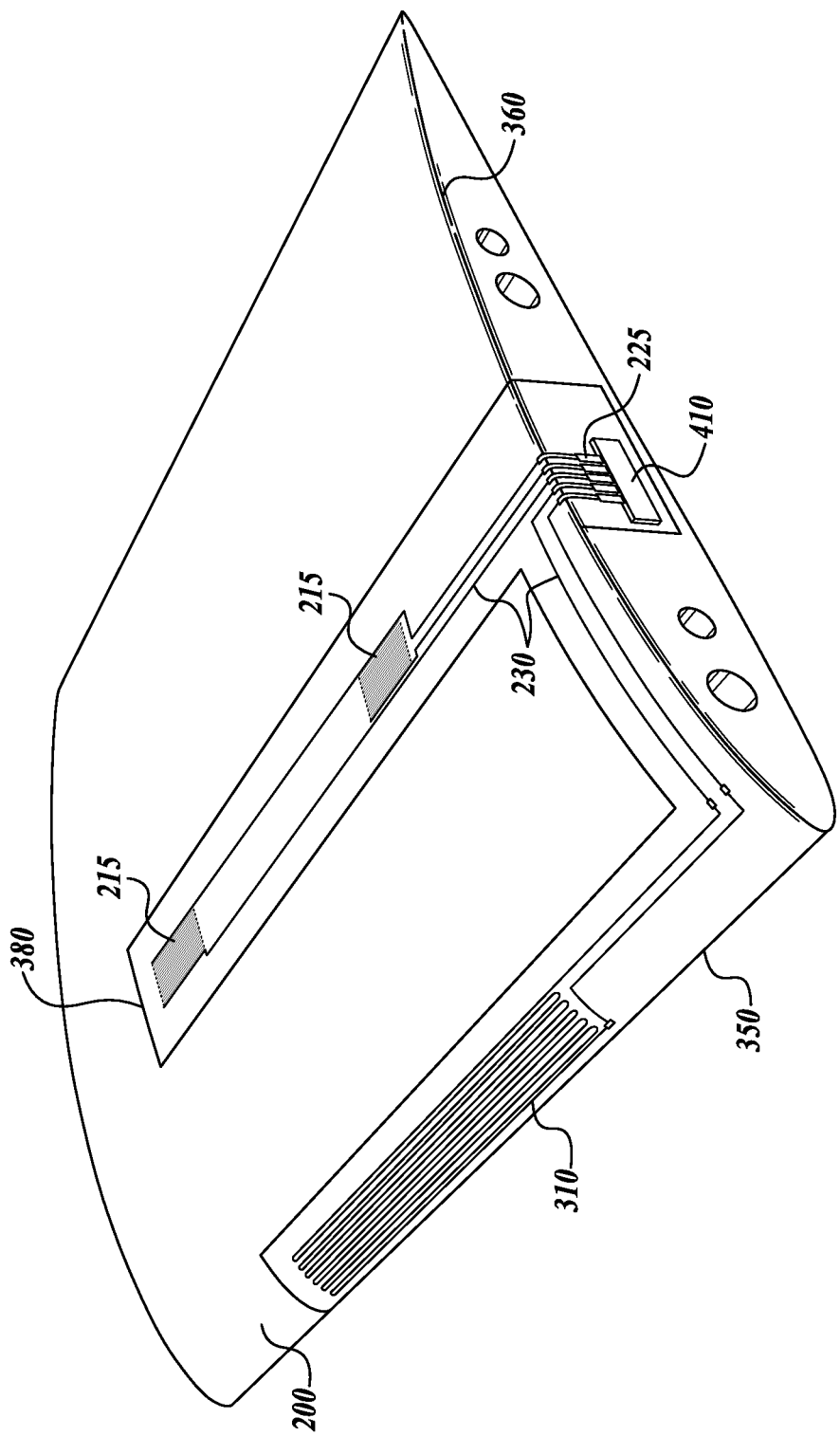
FIGS. 4A-4C are isometric views of a pSKIN mounted on an aircraft structure in accordance with an embodiment of the presently disclosed technology.
Figure 4B:
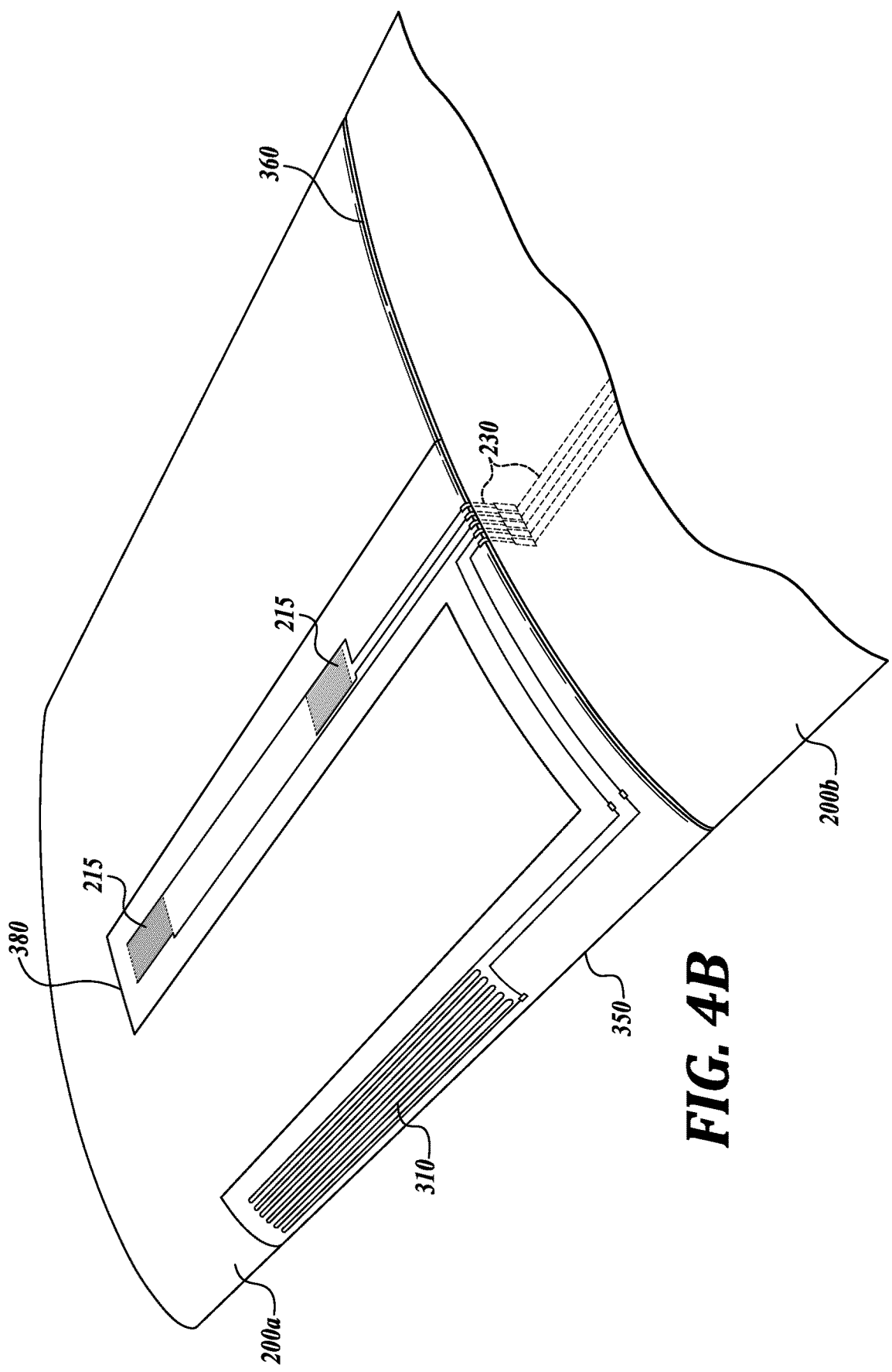
Figure 4C:
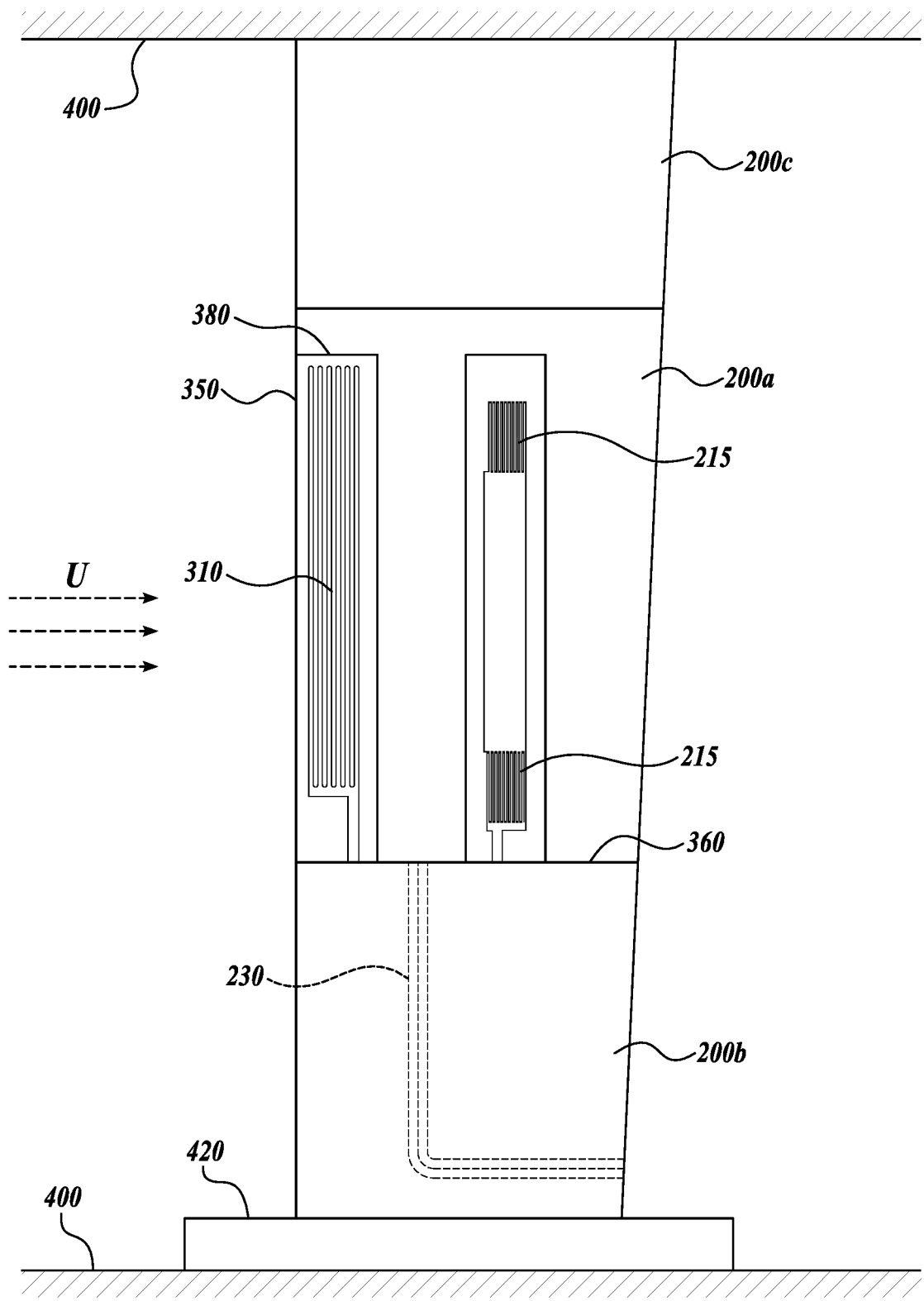

FIGS. 4A-4C are isometric views of the pSKIN 380 mounted on an aircraft structure in accordance with an embodiment of the presently disclosed technology. FIG. 4A shows the pSKIN 380 applied over the aircraft structure (e.g., an airfoil or a segment of the aircraft wing) 200 (collectively, a smart structure or a smart device). The illustrated pSKIN includes two sensors 215 and the actuator 310, but other combinations of sensors/actuators are also possible. In some embodiments, the pSKIN 380 may be folded over an edge 360 of the aircraft structure 200. An integrated circuit (IC) chip 410 may be connected to the connectors 225. In some embodiments, the IC chip 410 may be bonded or soldered to the connectors 225. In some embodiments, the IC chip 410 is on the side of the aircraft structure 200. As a result, the IC chip 410 and the connectors 225 may be better protected against the environment, as explained with reference to FIGS. 4B-4C below.

FIG. 4B shows an aircraft structure 200a connected to another aircraft structure 200b. In some embodiments the aircraft structures 200a, 200b may be segments of the aircraft wing or fuselage. In other embodiments, the aircraft structures 200a, 200b may be segments of a rotorcraft, e.g., segments of a helicopter propeller. Since the illustrated aircraft structures 200a, 200b butt against each other, the IC chip 410 and the connectors 225 are protected against the environment, e.g., rain or air drag. In some embodiments, conductive traces 230 or other wiring can electrically connect the pSKIN 380 with electronics (e.g., power supplies, controllers, etc.) away from the aircraft structure 200a. For example, the power supplies, controllers, etc. may reside on the aircraft itself, but away from the structure 200a. In some embodiments, the pSKIN 380 may be wirelessly connected (e.g., Bluetooth, WiFI, etc.) with external electronics.

FIG. 4C shows aircraft structures 200a, 200b, 200c that are mutually connected, and mounted on a stand 420 inside a wind tunnel 400. In some embodiments, the aircraft structure 200a has its leading edge 350 oriented to face an incoming airflow at velocity U. In some embodiments, the actuator 310 (e.g., a heater) may manipulate (e.g., heat up) the incoming air to change its physical properties. The downstream sensors 215 (e.g., thermocouples or strain gauges) may measure some physical properties (e.g., temperature of air or drag force) that are influenced by the upstream actuator 310. In some embodiments, the pSKIN 380 may be used for, e.g., deicing or flow control. As explained with reference to FIGS. 4A and 4B, the IC chip 410 and/or the connectors 225 are less exposed to the environmental force and degradation since they are not in the path of the flow. In some embodiments, the conductive traces 230 (or other wired or wireless connections) may connect the pSKIN 380 with electronics outside of the wind tunnel 400.

Figure 5:
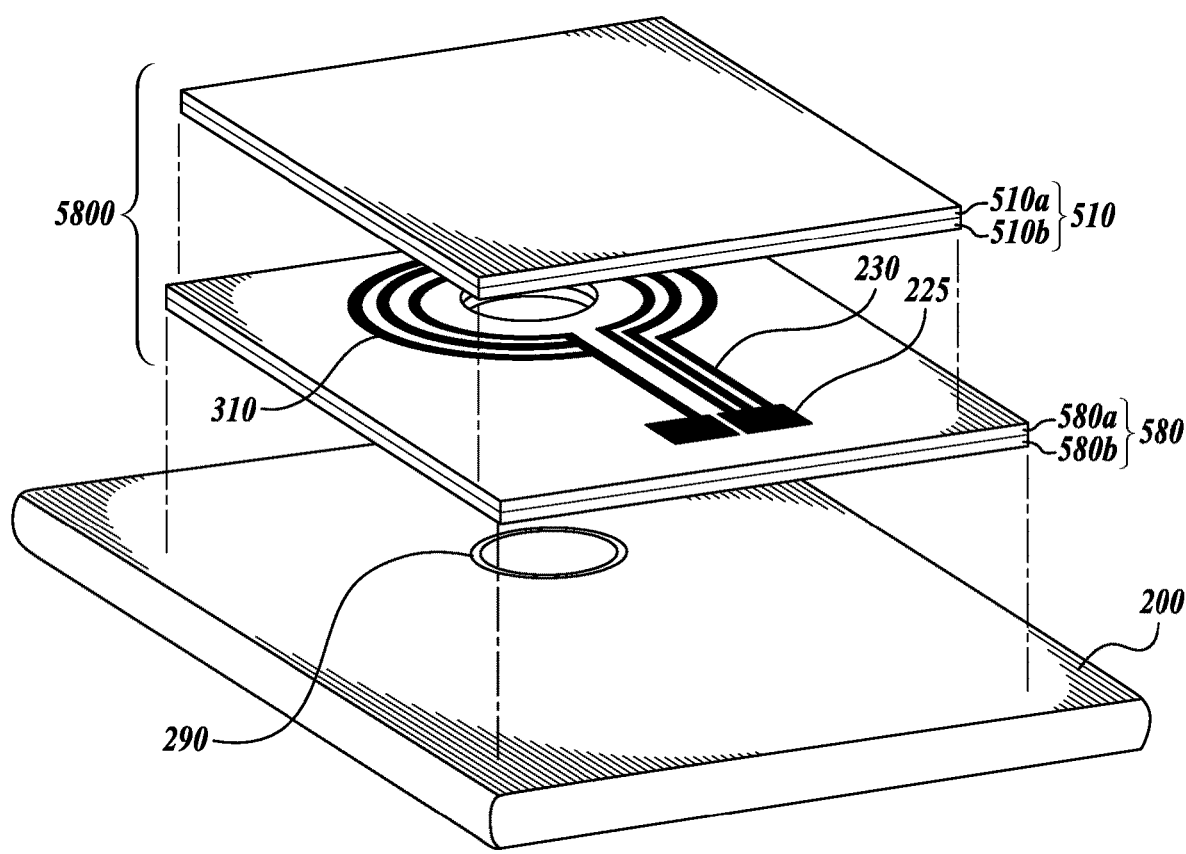
FIG. 5 is an exploded view of a pSKIN assembly in accordance with an embodiment of the presently disclosed technology.

FIG. 5 is an exploded view of a pSKIN assembly 5800 in accordance with an embodiment of the presently disclosed technology. In some embodiments, the pSKIN assembly 5800 includes a pSKIN 580 having a foil 580a (e.g., a polymer, wax paper, thin PCB, etc.) with the 3D-printed electronics and a layer of adhesive 580b (e.g., an epoxy). The illustrated pSKIN 580 is covered with a protective cover 510 having a protective foil 510a (e.g., a polymer) and a layer of adhesive 510b. In some embodiments, the protective cover 510 and/or the pSKIN 580 can be made by casting one-part epoxy resins onto a wax paper or olefin based foils. In some embodiments, the foils 580a/510a may be rigid enough to handle, yet remain pliable enough to conform to many curved surfaces. The sensors/actuators (e.g., a heater 310), conductive traces 230, and connectors 225 can be 3D-printed over the foil 580a. In some embodiments, the sensors, actuators and/or electronics of the pSKIN 580 may be made by lithography or screen printing. The combination of the pSKIN 580 and the protective cover 510 can be applied over the aircraft structure 200. In some embodiments, in-situ curing can be used to cure the pSKIN assembly 5800 without affecting the aircraft/host structure substrate using, for example, photonic based curing, UV based curing, electromagnetic systems such as induction heating and microwaves, and/or thermal blankets. In at least some embodiments, the cured pSKIN assembly 5800 retains good adhesion and functionality in presence of a hole 290 (e.g., a rivet hole).

Figure 6A:
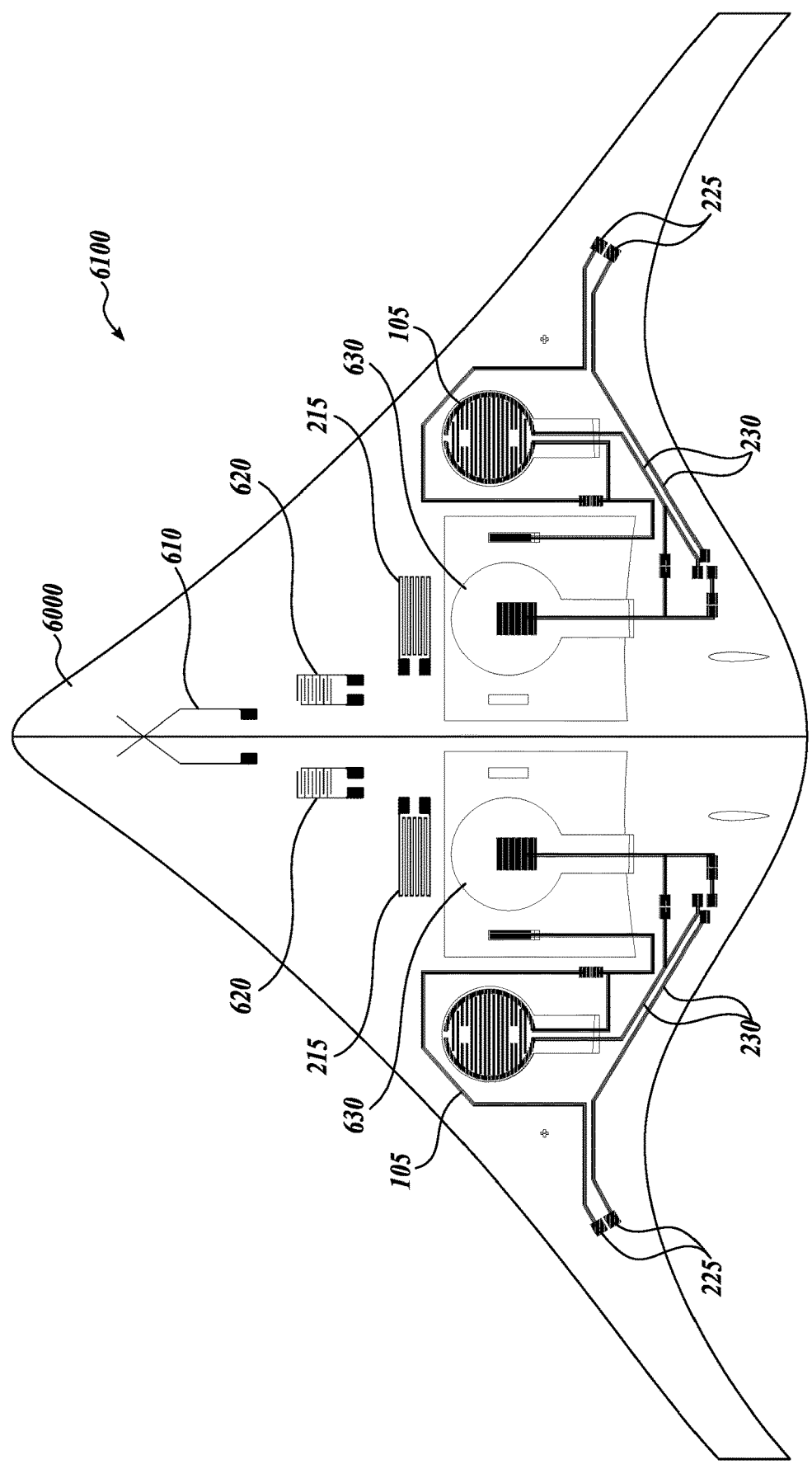
FIGS. 6A and 6B are plan and isometric views of an aircraft with sensors and actuators in accordance with an embodiment of the presently disclosed technology.
Figure 6B:
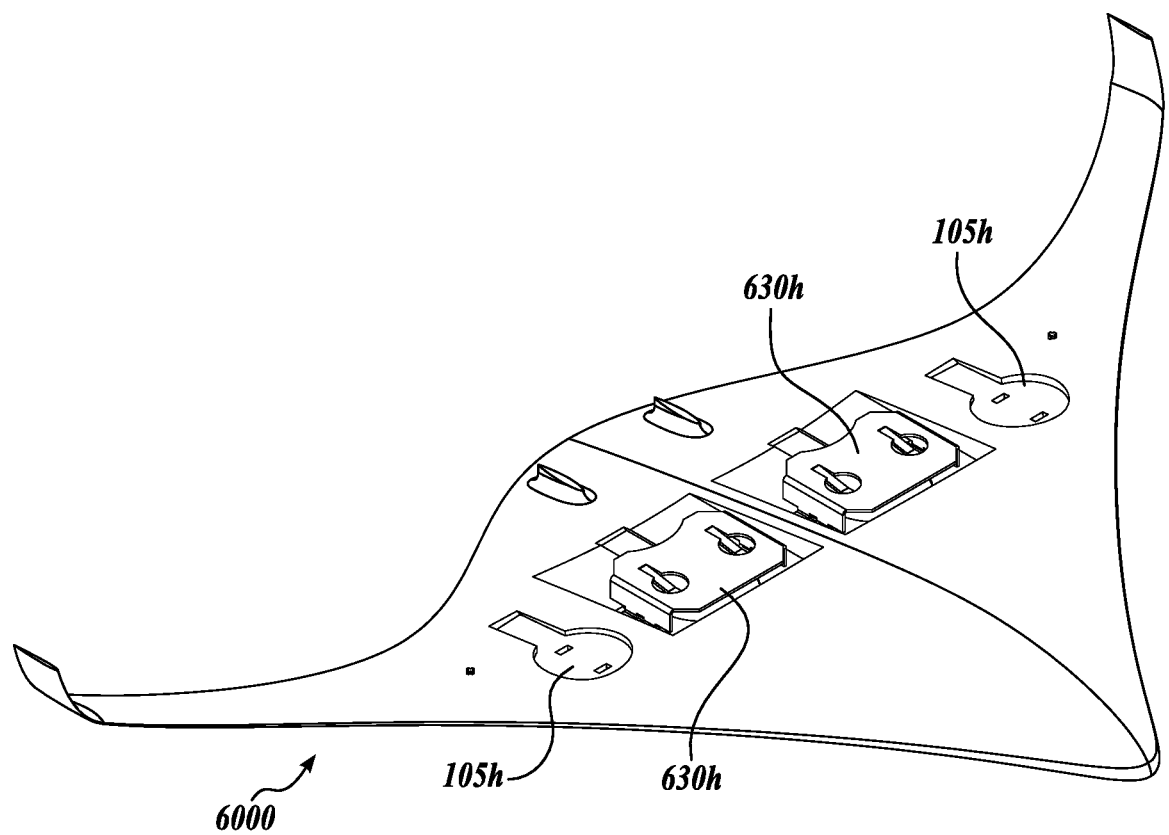

FIGS. 6A and 6B are plan and isometric views of an aircraft 6000 that carries sensors and actuators in accordance with an embodiment of the presently disclosed technology. FIG. 6A is a plan view of the aircraft 6000 that includes several sensors, actuators and power supplies (e.g., batteries). Collectively, the aircraft 6000 and the sensors/actuators/electronics may be referred to as a smart structure or a smart device 6100. The aircraft 6000 may be, for example, an unmanned airplane, but other types of aircraft are also possible.

FIG. 6A shows an embodiment of the aircraft 6000 that carries several sensors and actuators: thermocouples 610, ice sensors 620, sensors 215 (e.g., strain sensors), and pressure sensors 105 (collectively, pSKIN or printed multifunctional skin). Other numbers and arrangement of the sensors and actuators are also possible. In some embodiments, the sensors/actuators may be at least in part powered by batteries 630. In some embodiments, the aircraft 6000 may include electronics (not shown) for digital or analog processing, wireless data transmission to ground or to another aircraft, etc. For example, the aircraft 6000 may include heaters that are turned on and off based on the signal from the ice sensors 620 that is processed by the on-board electronics. In other embodiments, high-bandwidth pressure sensors can be coupled with ionic wind generators for boundary layer control. Furthermore, distributed sensors can be used to determine the position of streamwise vortices, and then surface electrodes for ionic wind may nudge or force the vortices back to their optimal location using a closed-loop control system. As a result, more efficient aerodynamic vehicles with low skin friction can be developed to, for example, reduce fuel consumption.

FIG. 6B shows the aircraft 6000 that has openings in the aircraft for housing the sensors, actuators and power supplies. For example, in some embodiments, openings 105h may be shaped and configured to receive the pressure sensors 105, and openings 630h may be shaped and configured to receive the batteries 630. Manufacturing of the openings 105h, 630h is discussed with reference to FIGS. 7A-7F below.

Figure 7A:
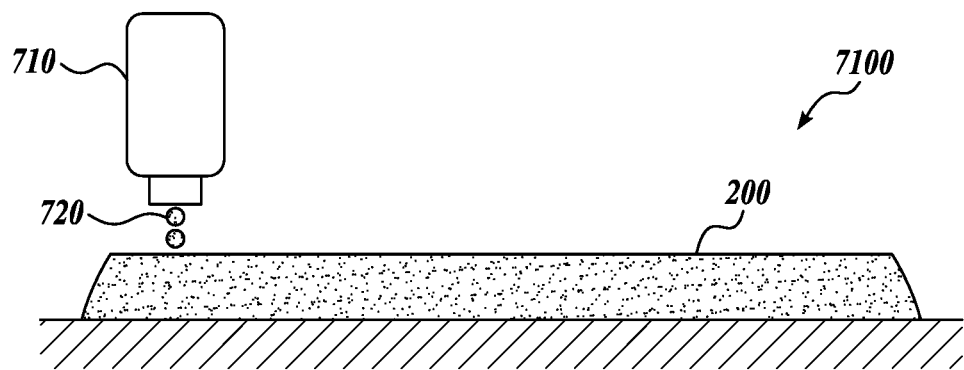
FIGS. 7A-7F are schematic views of equipping an aircraft structure with sensors and actuators in accordance with an embodiment of the presently disclosed technology.

FIGS. 7A-7F are schematic views of equipping an aircraft structure with sensors and actuators in accordance with an embodiment of the presently disclosed technology. FIG. 7A schematically illustrates a step 7100 for manufacturing the aircraft structure 200. In some embodiments, a 3D printer 710 may eject a 3D material 720 (e.g., aerosols, powdered metals, melted materials, polymer ceramic composites, etc.) that form the aircraft structure 200. The 3D printer 710 may be controlled by a controller or a computer (not shown).

Figure 7B:
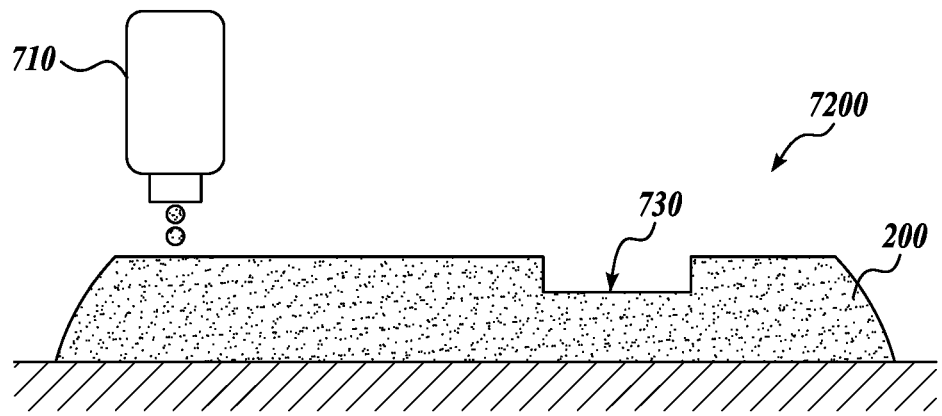

FIG. 7B schematically illustrates a step 7200 for manufacturing the aircraft structure 200. In the step 7200, an opening 730 (e.g., a pocket or a housing) is created for housing the electronics for sensors/actuators.

Figure 7C:
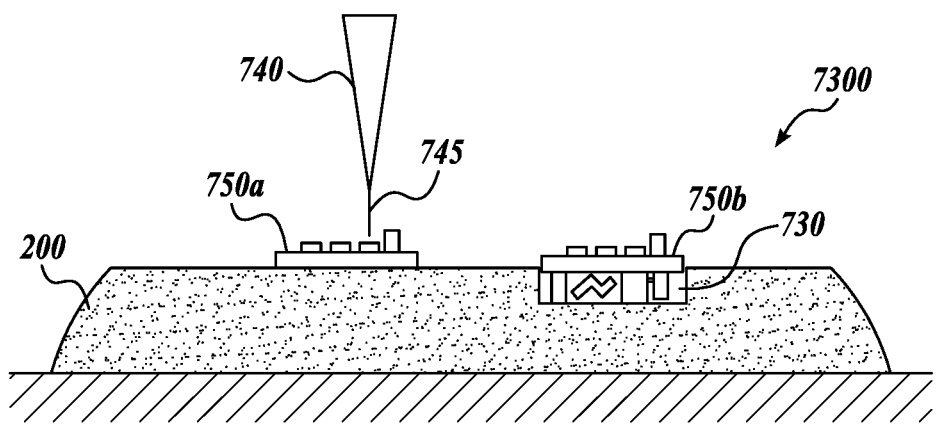

FIG. 7C schematically illustrates a step 7300 for manufacturing the aircraft structure 200. In the step 7300, an electronics printer 740 (also referred to as "3D electronics printer" or "additive electronics printer" or "direct write electronics printer") prints electronics 750a for supporting the sensors/actuators. The electronics printer 740 places a functional material 745 on the surface the electronics 750a.

Active and passive elements may be placed directly on the surface or inside the pockets of the aircraft structure 200. In some embodiments, the electronics printer 740 can directly deposit a range of commercial and custom electronic materials such as resistors, conductors (copper, silver, gold, etc.), dielectrics, piezoelectrics, carbon nanotubes, adhesives, polymers, and other materials. Using these materials, different sensors, resistors, capacitors, transducers, interconnects, coils, active circuit elements, and/or antennas may be fabricated over the aircraft structure 200. In some embodiments, electronics 750b may also be printed in-situ or may be pre-made using a 3D printer or conventional methods (e.g., surface mount technologies).

Figure 7D:
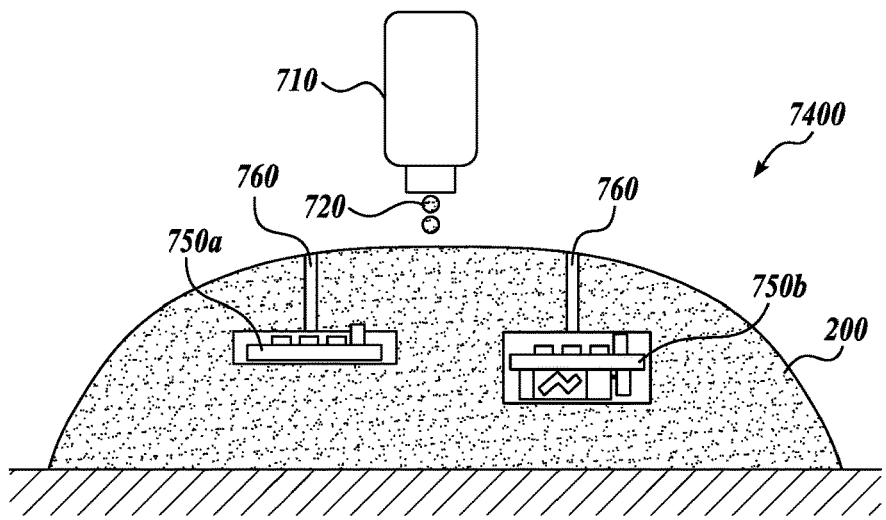

FIG. 7D schematically illustrates a step 7400 for manufacturing the aircraft structure 200. In the step 7400, a buildup of the aircraft structure 200 continues using the 3D printer 710. In some embodiments, the electronics 750a/750b may become encapsulated in the 3D material 720, leaving openings 760 for accessing the electronics 750a/750b.

Figure 7E:
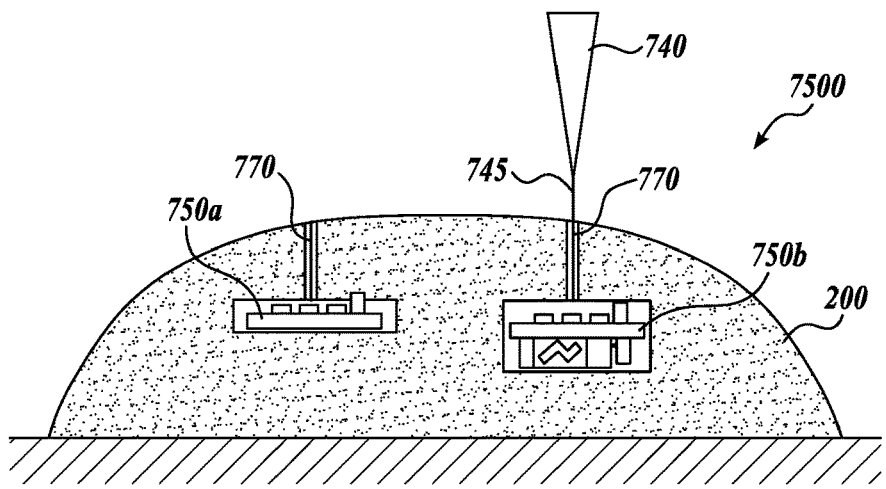

FIG. 7E schematically illustrates a step 7500 for manufacturing the aircraft structure 200. In the step 7500, a wiring 770 may be added by the electronics printer 740. In some embodiments, the 3D printer 710 may print conductive materials, e.g., the wiring 770 inside the openings 760. In some embodiments, the wiring 770 may connect the electronics 750a/750b to the surface of the aircraft structure 200.

Figure 7F:
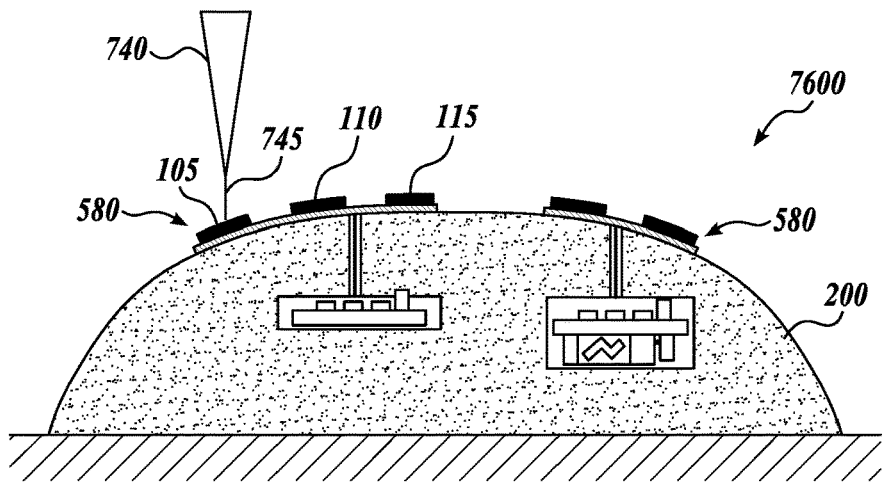

FIG. 7F schematically illustrates a step 7600 for manufacturing the aircraft structure 200. In the step 7600, the electronics printer 740 may add, for example, the pressure sensor 105, the temperature sensor 110 and the strain sensor 115 to the surface of the aircraft structure 200. In other embodiments, different combinations of the sensors/actuators may be added by the electronics printer 740, for example, the pSKIN 580 may combine thermistor-based temperature sensors, strain gauges, and pressure sensors. Generally, the sensors/actuators are relatively thin in comparison to the aircraft structure 200. For example, in some embodiments, the sensors/actuators may be less than 10 μm, less than 100 μm, or less than 2 mm thick. In some embodiments, the wiring 770 connect the electronics 750a/750b with the sensors/actuators of the pSKIN 580.

Figure 8:
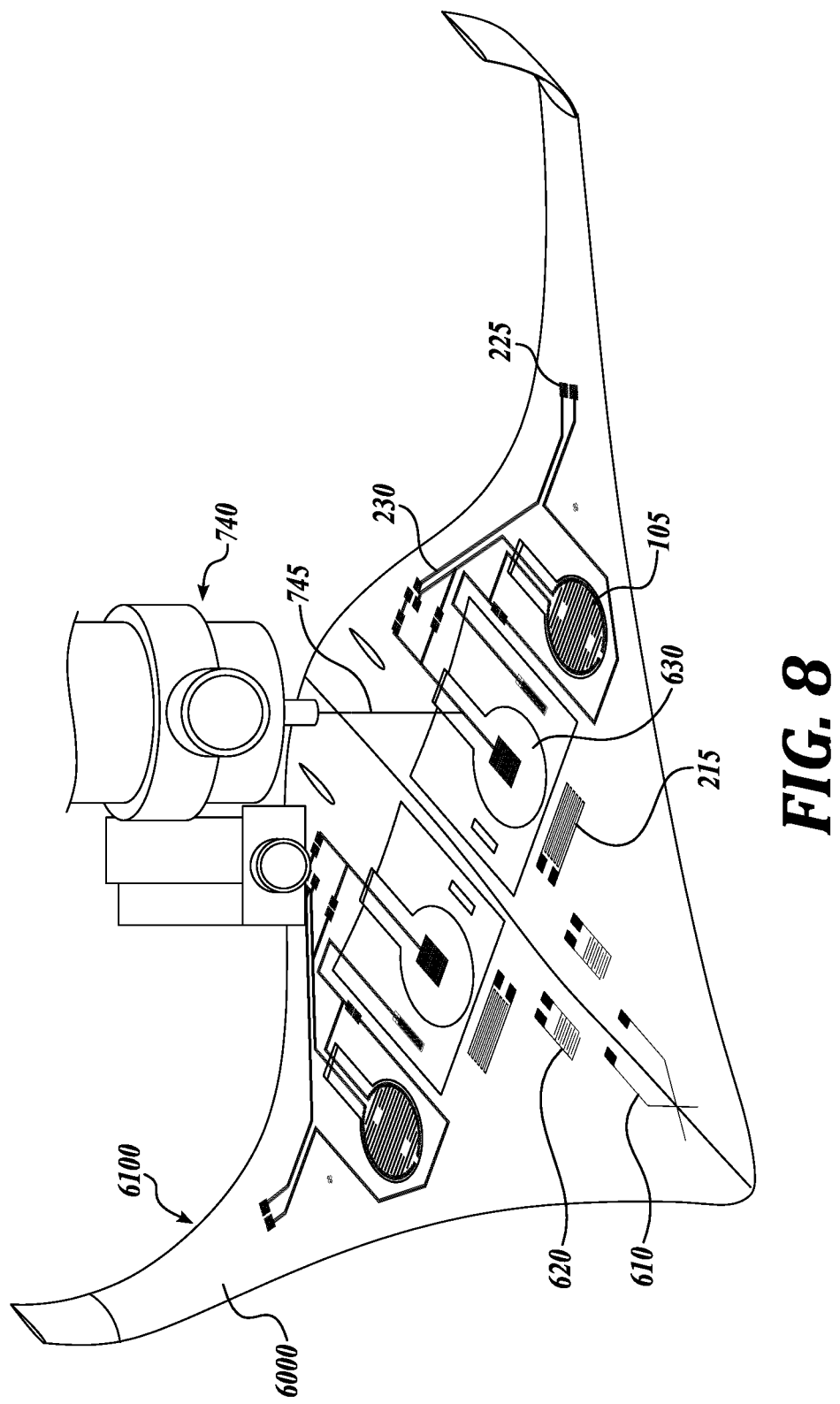
FIG. 8 is an isometric view of printing sensors and actuators over an aircraft in accordance with an embodiment of the presently disclosed technology.

FIG. 8 is an isometric view of printing sensors and actuators over the aircraft 6000 with in accordance with an embodiment of the presently disclosed technology. In some embodiments, the electronics printer 740 may be positioned above the aircraft 6000, and may be driven by a computer controlled positioning system (not shown). In some embodiments, the electronics printer 740 may use different functional material for printing different components of the pSKIN (e.g., the functional material for the conductive traces 230 and dielectric-based ink for the insulation of the ice sensor 620). Some embodiments of the sensors that are manufacturable by the electronics printer 740 are temperature sensors, strain sensors, static or low frequency pressure sensors, force sensitive resistors, dynamic or high frequency pressure sensors, heat flux sensors, negative pressure or vacuum sensors, piezoelectric sensors, vibration sensors, impact sensors, airflow sensors, acoustic sensors, electric field sensors, antennas, magnetic field sensors, crack detection sensors, ice sensors, sensors detecting other characteristics relating to flight, sensors detecting other characteristics of the environment, sensors detecting other characteristics relating to aircraft structural health, and a metamaterial with an ordered one-dimensional, two-dimensional or three-dimensional structure. Some embodiments of the actuators that are manufacturable by the electronics printer 740 are: ice remediation heaters, ion actuators, plasma actuators, piezoelectric transducers, aircraft controls, and other planar functional devices printed or adhered to the surface of the aerodynamic structure. In some embodiments, the actuators are functional coatings that change the surface temperature, color (optical properties), texture/roughness, luminosity (lights/infrared signature), and/or other properties of the surface. These actuators may be deposited by 3D-printing.

Electronics Printer

In some embodiments, an OPTOMEC Aerosol Jet (AJ) system can be used as the electronics printer 740. The pSKIN sensors/actuators may be printed directly on metallic structures, other 3D-printed structures, and other suitable substrates such as composites. Some examples of functional material 745 are: carbon nanotube inks, conductors (e.g., metals), insulators, semiconductors, semimetals, resistors, dielectrics, adhesives, epoxies, filled epoxies, polymers, filled polymers, elastomers, filled elastomers, ceramic particulates, piezoelectric materials, magnetic materials, functional materials, graphene inks, biological materials, and composites of these material.

Printed Strain Gauge Sensors

In some embodiments, the strain sensor (strain gauge) 115 can be printed over different substrates (e.g., aircraft structure 200): glass, polyimide, composite materials, ceramics, and anodized aluminum 2024 T3. The functional materials 745 may include metals, elastomers, piezolectrics, PARU silver nano ink, Heraeus PEDOT:PSS 1000 and Brewer Science Carbon Nano Tube (CNT) inks. In some embodiments, the electrical resistance for the functional material 745 is between 100Ω and 350Ω for Pam silver, around 200 kΩ for CNTs and between 0.4 MΩ and 0.6 MΩ for PEDOT:PSS. Since aluminum is conductive, several layers of Sigma Aldrich polyimide may be printed onto the aluminum aircraft structure 200 prior to the conductive ink application. In some embodiments, the strain sensors (strain gauges) can be printed in about 10 layers with a total print time of about 60 minutes at 4 mm/s translations.

Printed Temperature Sensors

In some embodiments, the temperature sensors 110 are thermocouples or thermistors. Conventional manufacturing of the thermocouples requires an oxygen free atmosphere and high curing temperatures. In some embodiments of the present technology, a low-temperature curing process for the thermocouples can be used by having the functional material that requires low processing temperature conditions.

In some embodiments, the thermistors can be made of semiconducting mixtures of oxides of transition metals with low processing temperature conditions (e.g., silicon based silistors, switching type materials, or graphite). In some embodiments, these materials may be solvable in a solvent to produce the functional material 745. In one embodiment, the functional material 745 may include Molybdenum Disulphide (MoS2) and Molybdenum Disulphide (MoS2) diluted 1:1 with Toluene (polar solvent), to lower viscosity and to facilitate printing. In other embodiments, the functional material 745 may include Molybdenum Disulphide (MoS2), Magnetite, and poly (3,4-ethylenedioxythiophene) polystyrene sulfonate (PEDOT:PSS).

Printed Pressure Sensors

In some embodiments, the sensors may include printed pressure sensors 105, for example, Force Sensitive Capacitors (FSCs), Force Sensitive Resistors (FSRs), and/or Lead Zirconate Titanate (PZT) sensors. In an embodiment, the FSC can operate by continuously evaluating a capacitance of a printed capacitor having two parallel conductive plates separated by a dielectric material. The capacitance of the capacitor may by modeled by the equation $C=k\varepsilon A/D$, where k is the permittivity of the dielectric between the plates, $\varepsilon$ is the permittivity of space, A is the area of the capacitor, and D is the thickness of the dielectric. By printing these sensors using appropriate functional materials 745, the conductor plates and dielectric material can be made relatively thin, increasing the static capacitance of the sensor. In some embodiments, the printed conductor plates/dielectric material may have the thickness of about 100 nm to 30 μm. In some embodiments, PARU silver nano ink can be used as the conductive material, and Sigma Aldrich polyimide as the dielectric layer.

In some embodiments, the sensors (e.g., pressure sensors) may be manufactured by sintering micro-scale lead zirconate titanate (PZT) films with relatively low substrate temperature increases. In other embodiments, the functional material 745 may include ink formulated from PZT nanoparticles, solvent, dispersant and adhesion promoter. In some embodiments, the inks may dry for a few hours (e.g., two hours) in a vacuum at about 200° C. In some embodiments, the functional material 745 may be photonically sintered using sub-millisecond pulses of broad spectrum light. In some embodiments, the remanent polarization and coercive field for thermally sintered PZT film were 16.1 μC/cm2 and 4.3 kV/cm, respectively. For the photonically sintered materials, the remanent polarization can be 27.7 μC/cm2 and coercive field can be 3.1 kV/cm. The piezoelectric voltage constants (g31) for the two film groups can be $-5.0 \times 10^{-3}$ V-m/N (for thermally sintered functional material) and $-5.5 \times 10^{-3}$ Vm/N (for photonically sintered functional material). For at least some embodiments, the foregoing values indicate that the PZT films were successfully sintered. In some embodiments, to avoid the relatively high temperature of sintering the conventional PZT material, a colloidal based functional material 745 may be used. As a result, instead of conventional sintering at about 600° C., the curing and sintering of the PZT particles in the functional material 745 may occur in a temperature range of 150-200° C., therefore being suitable for direct printing over many metallic and non-metallic aircraft structures 200.

Figure 9:
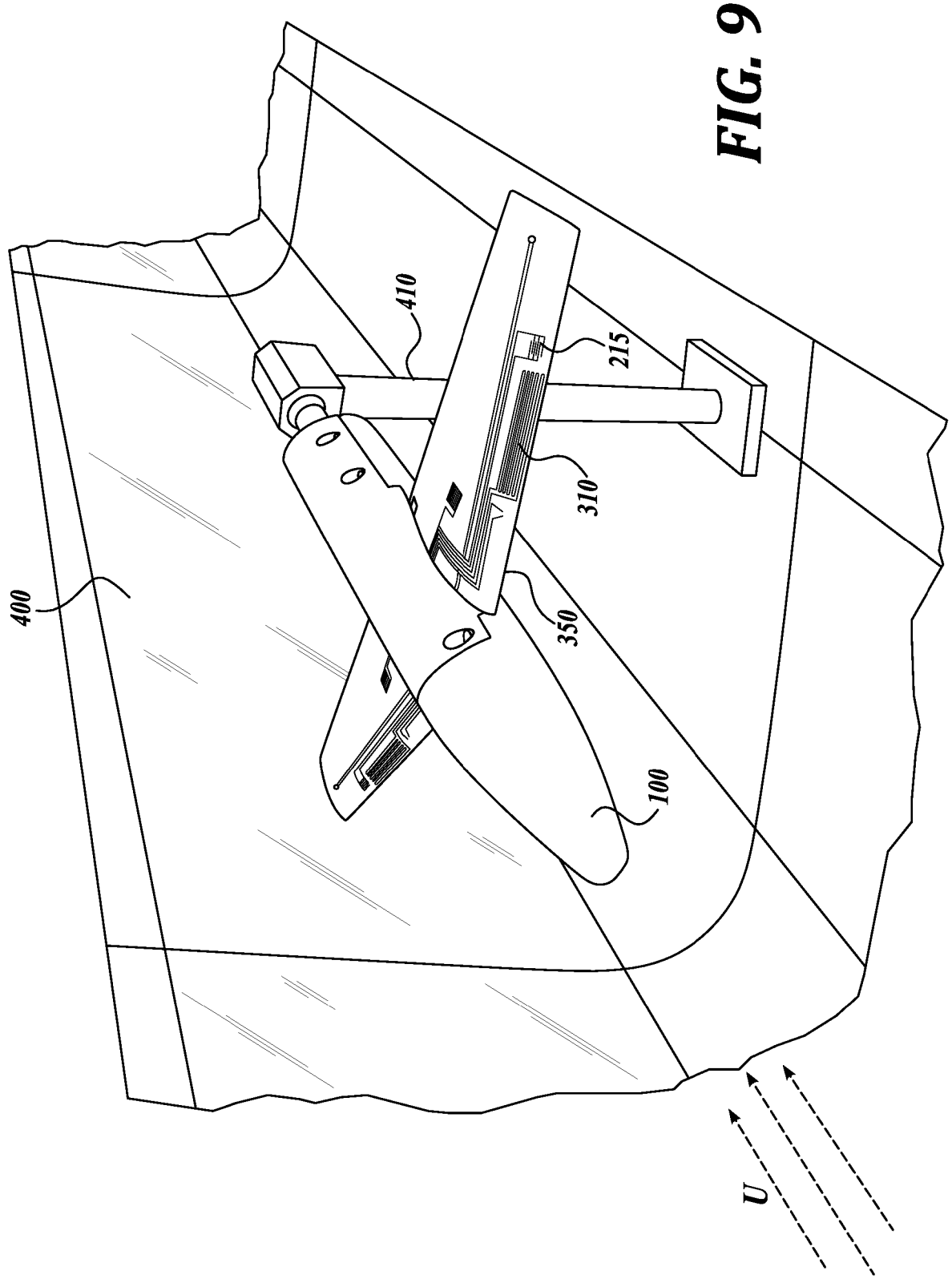
FIG. 9 is an isometric view of a wind tunnel testing of sensors and actuators in accordance with an embodiment of the presently disclosed technology.

FIG. 9 is an isometric view of a wind tunnel testing of sensors and actuators in accordance with an embodiment of the presently disclosed technology. In the illustrated embodiments, the aircraft 100 carries the sensor 310 (e.g., a heater) and the sensor 215 (collectively, pSKIN). The aircraft 100 is mounted on the stand 420, and oriented to face the incoming airflow at velocity U. In some embodiments, the sensors/actuators of the pSKIN may make measurements and/or manipulate the fluid flow to, for example, improve flight characteristics of the aircraft 100.

Figure 10A:
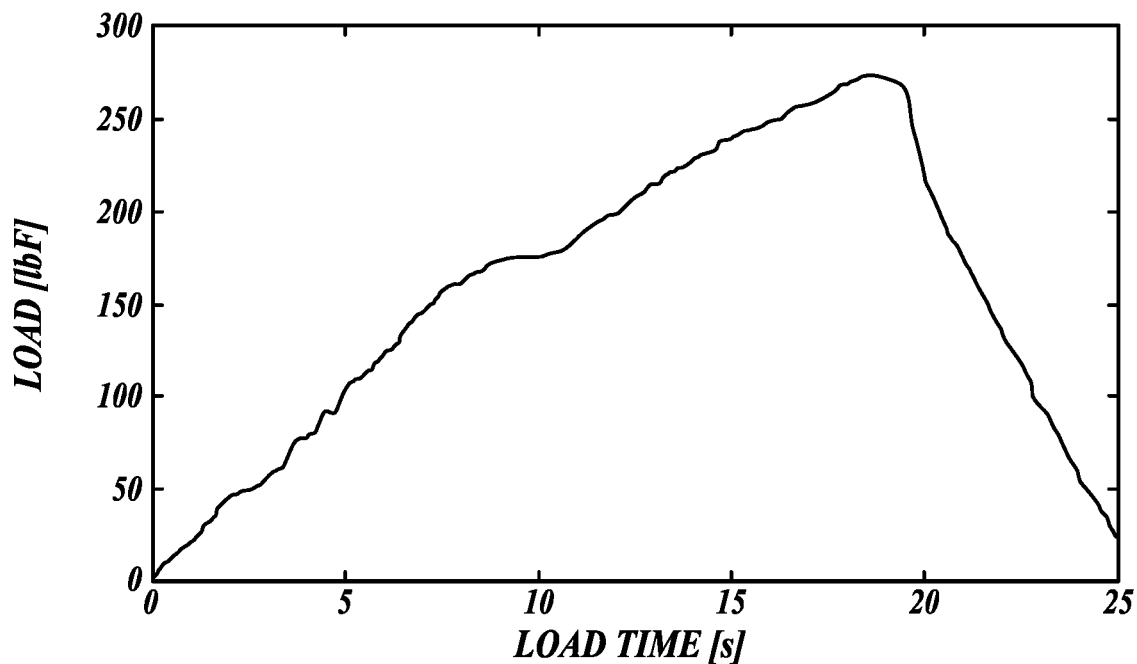
FIGS. 10A and 10B are graphs of load measurements in accordance with an embodiment of the presently disclosed technology.
Figure 10B:
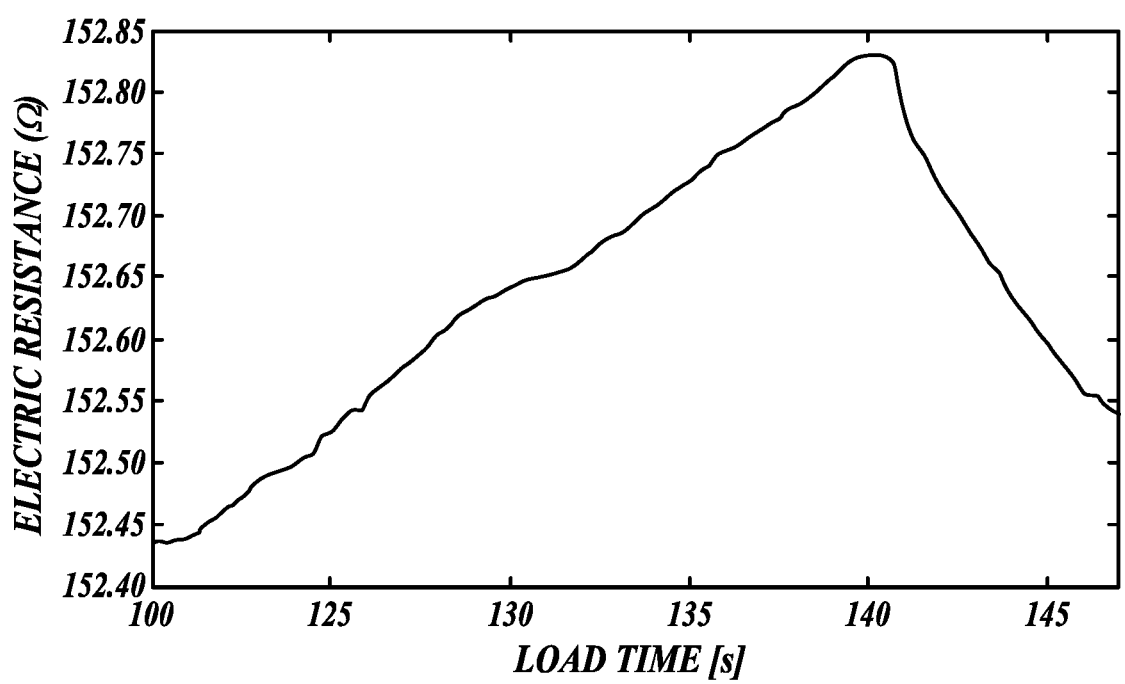

FIGS. 10A and 10B are graphs of load measurements in accordance with an embodiment of the presently disclosed technology. In particular, FIG. 10A is a graph of the load over time, and FIG. 10B is a graph of the measured load over time. The horizontal axes for both graphs are time in seconds.

The vertical axis of the graph in FIG. 10A corresponds to applied load in lbF. In the illustrated embodiment, the applied load increases over the time, reaches a peak of about 250 lbF after about 19 seconds, and then decreases to about 25 lbF after 25 seconds. In some embodiments, the load may be applied over an aircraft structure (e.g., a wing of an aircraft).

The vertical axis of the graph in FIG. 10B corresponds to the resistance in $\Omega$ of a strain sensor (e.g., the strain sensor 115 placed over an aircraft wing). The behavior of the measured resistance in $\Omega$ in FIG. 10B generally corresponds to the loading shown in FIG. 10A, i.e., the shape, maximum, and minimum of the graph in FIG. 10B generally follows the shape of graph in FIG. 10A, therefore indicating a generally linear response of the strain sensor. In at least some embodiments, a linear response of a sensor is a preferred response.

Figure 11A:
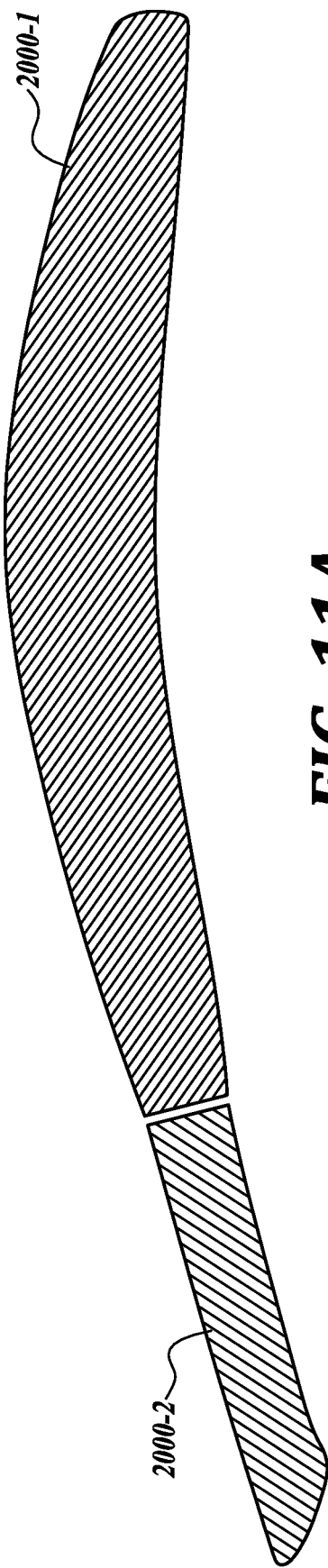
FIGS. 11A-11C are cross-sectional views of aerodynamic structures in accordance with an embodiment of the presently disclosed technology.
Figure 11B:
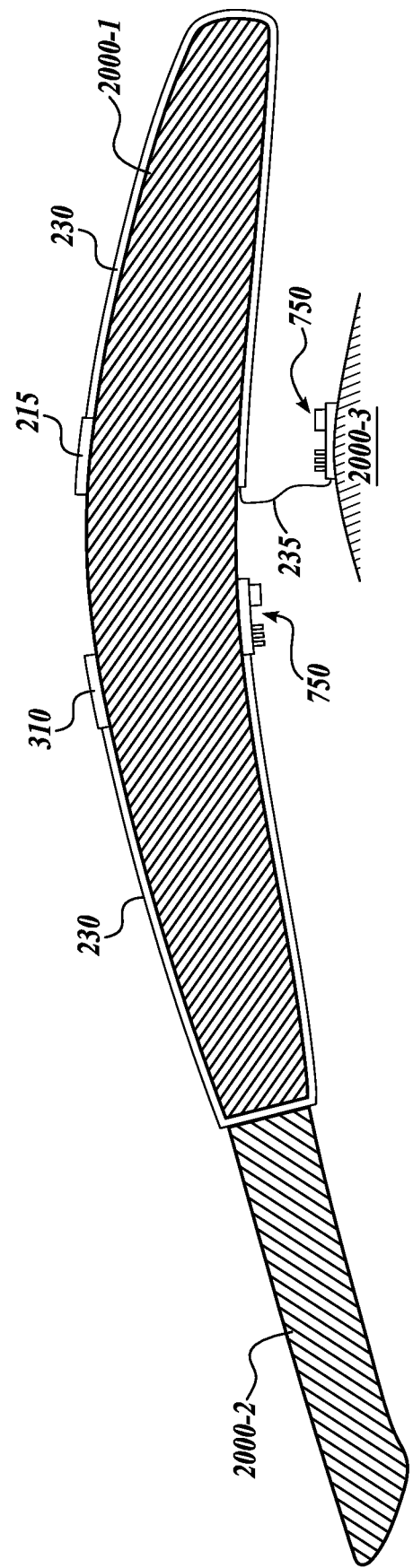
Figure 11C:
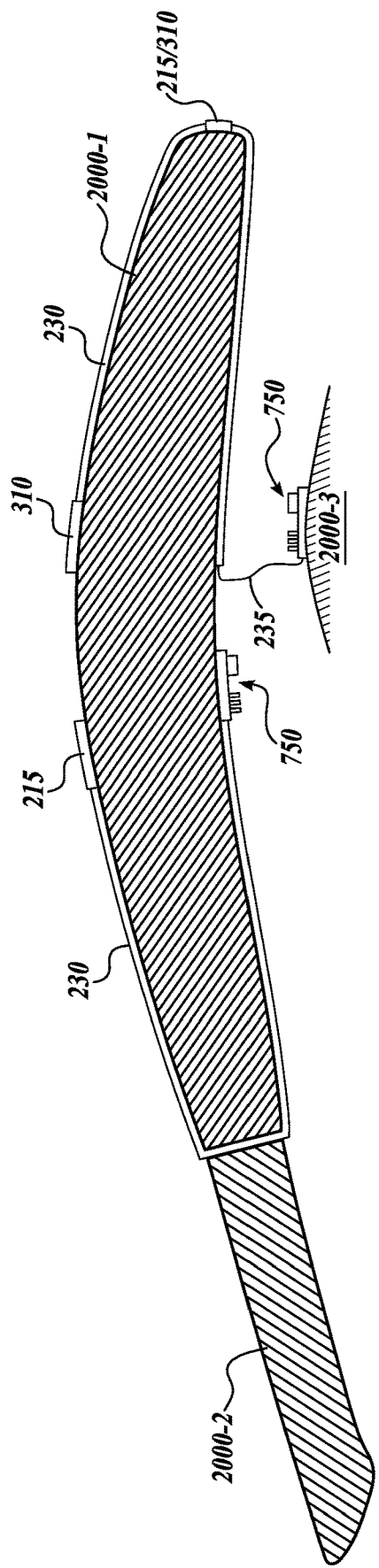

FIGS. 11A-11C are cross-sectional views of aerodynamic structures in accordance with an embodiment of the presently disclosed technology. In some embodiments, a combination of the aerodynamic structures may be referred to as an aerodynamic apparatus or device (e.g., an airplane, a rotorcraft, an unmanned aerial vehicle, a fan, a turbine, a pump, a submarine, a boat, a car, a train, a motorbike, a helmet, a pair of glasses, goggles, a windshield, etc.). FIG. 11A shows aerodynamic structures (e.g., aircraft wing sections) 2000-1 and 2000-2.

FIG. 11B shows aerodynamic structure 2000-1 that carries pSKIN. In the illustrated embodiment, one side of the aerodynamic structures 2000-1 includes the heater 310 and the strain gauge 215, but other types and numbers of 3D-printed sensors, actuators, and devices are also possible. The printed conductive traces 230 electrically connect these 3D-printed elements (e.g., sensors, actuators, other devices) of the pSKIN with the electronic components 750 at a surface on the opposite side of the aerodynamic structures 2000-1. As a result, the electronic components 750, which may be sensitive to heat, pressure, moisture, etc., can be better protected against environmental conditions. In some embodiments, a cable 235 may electrically connect the sensors/actuators/devices to the electronic components 750 at the internal side of the aerodynamic structures. For example, a rotorcraft blade 2000-1 may be electrically connected with a hub 2000-3 via the cable 235.

FIG. 11C shows the aerodynamic structure 2000-1 that carries some components of the pSKIN at its leading or trailing edge. For example, the strain gauge 215 and/or the heater 310 may be disposed at the leading or trailing edge of the aerodynamic structure 2000-1. In other embodiments, additional or different locations for the components of the pSKIN are also possible.

FIGS. 12A-12C are cross-sectional views of the aerodynamic structures in accordance with an embodiment of the presently disclosed technology. FIG. 12A shows spacing at the mechanical interfaces (connections) between the aerodynamic structures 2000-1, 2000-2 and 2000-4. In operation, an outer or external surface (ES) of the aerodynamic structures 2000-1, 2000-2 and 2000-4 faces the outside environment (OE), while an inner or internal surface (IS) faces, for example, the inner environment (IE) of the interior of the plane. As a non-limiting example, the aerodynamic structures 2000-1, 2000-2 and 2000-4 may be outside panels of an aircraft wing or fuselage, while the aerodynamic structure 2000-3 may be the interior of the aircraft wing or fuselage. Generally, the environmental conditions at the ES can be significantly different than those at the IS. For example, temperature extremes, moisture content oscillations, pressure extremes, etc. may be significantly higher at the ES than at the IS.

FIG. 12B shows elements of the pSKIN at the ES of the aerodynamic structure 2000-1. The traces 230 that connect the elements of the pSKIN at the ES of the aerodynamic structure with the electronic components 750 at the IS may partially run along the interfaces between the aerodynamic structures 2000-1, 2000-2, 2000-4). In general, the aerodynamic structures may be curved or flat, and their edges may be curved (e.g., through a fillet at the edge) or may include relatively sharp edges. In some embodiments, a fillet radius of the edge may be larger than 300 µm to reduce damage to the traces 230 during fabrication, assembly and/or operation. In general, sharp edges tend to damage deposited inks, therefore potentially breaking the electrical continuity of the trace 230. In some embodiments, sharp edges of a structure can be covered with a non-conductive layer (e.g., polyimide, epoxy, or aluminum oxide) to provide a smooth edge for the printed interconnects. The same procedure may be used on thin structures (e.g., where the thickness is less than 3 mm).

FIG. 12C shows the aerodynamic structure 2000-1 that has vias 1230 for routing the traces 230 through the structure. In some embodiments, the vias 1230 are relatively small perforations (e.g., having a diameter in the range of 200 µm to 1000 µm) that extend between the ES and the IS of the aerodynamic structure. In different embodiments, the traces 230 may be 3D-printable within the vias 1230. In some embodiments, pre-made interconnects (e.g., pins) may be inserted through the vias 1230 to make electrical connections between the ES and the IS of the aerodynamic structure. The diameter and separation between vias 1230 may depend on the material thickness, electrical conductivity requirements, substrate electrical properties (i.e. conductive vs non-conductive), position on the aerodynamic structure, and pressurization requirements based, for example, on a difference of pressure between the ES and IS, and the strength of the material of the aerodynamic structure.

Figure 13:
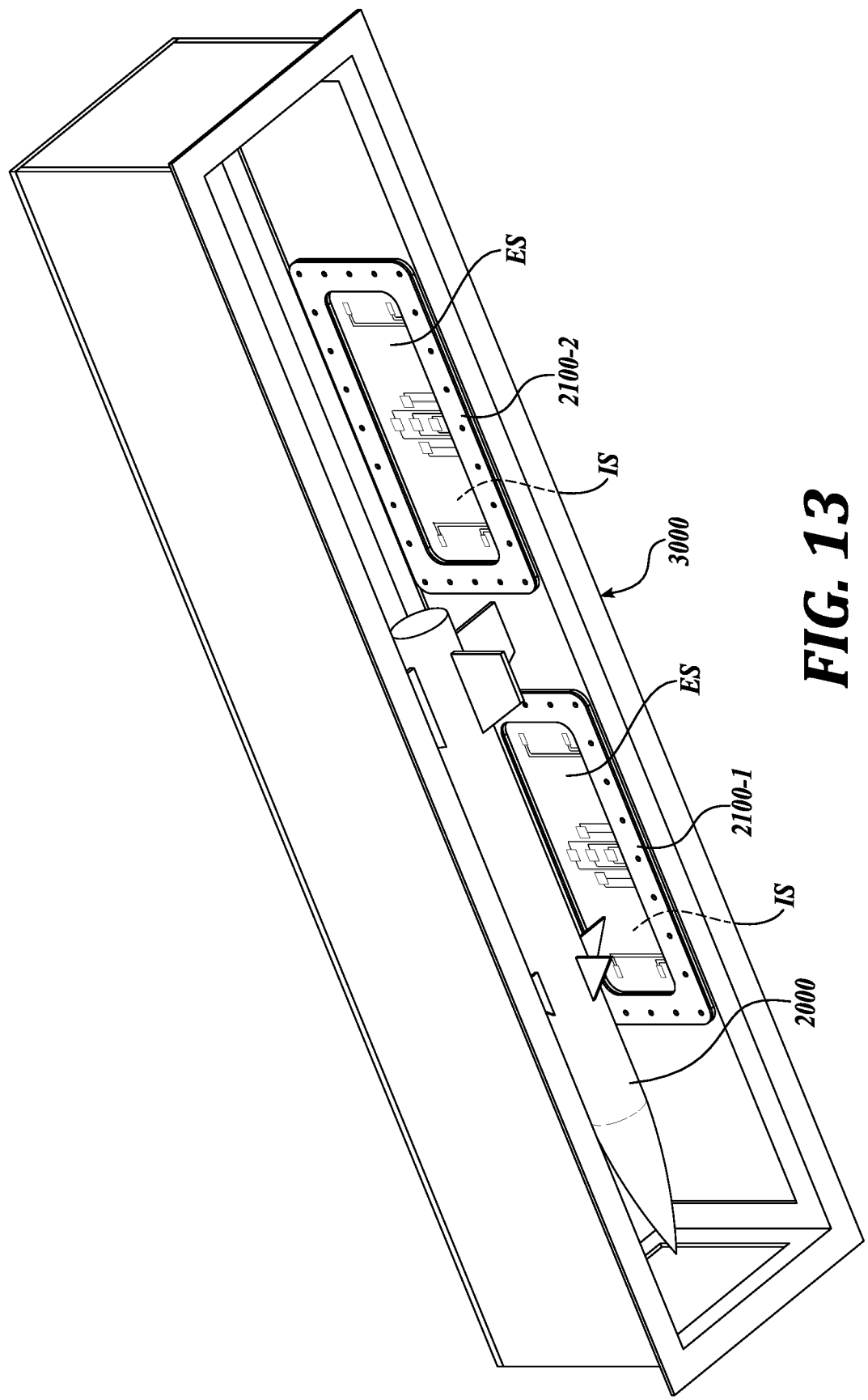
FIG. 13 is an isometric view of the aerodynamic structures in accordance with an embodiment of the presently disclosed technology.

FIG. 13 is an isometric view of an aerodynamic structure in accordance with an embodiment of the presently disclosed technology. FIG. 13 shows a cavity or bay in an aircraft structure 3000 (e.g., landing gear well, cargo bay, service panel, pod, etc.) that houses an aerodynamic structure or apparatus 2000 (e.g., a missile). In some embodiments, the aircraft structure 3000 protects the aerodynamic structure 2000 during, for example, lab testing or operational flight (e.g., before the release of the missile 2000). In some embodiments, the structure 3000 may be carried by an aircraft or may be configured in a wind tunnel section.

In some embodiments, one or more panels 2100 are instrumented with 3D-printed sensors and/or actuators (e.g., pressure sensors, thermal actuators, temperature sensors, strain gages, antennae, transducers etc.). These sensors/actuators/devices may be disposed on the external surface ES of the panel 2100. In the context of FIG. 13, the external surface ES is the one that faces the airflow conditions inside the cavity of structure 3000, i.e., the external surface ES of the panel 2100 faces the missile 2000. The internal surface IS faces the more benign conditions outside of the structure 3000, therefore, for example, having the electronic components less exposed to the harsh environment within the structure 3000. Some embodiments of the pSKIN placement and trace routing are described below with respect to FIGS. 14-14B.

Figure 14:
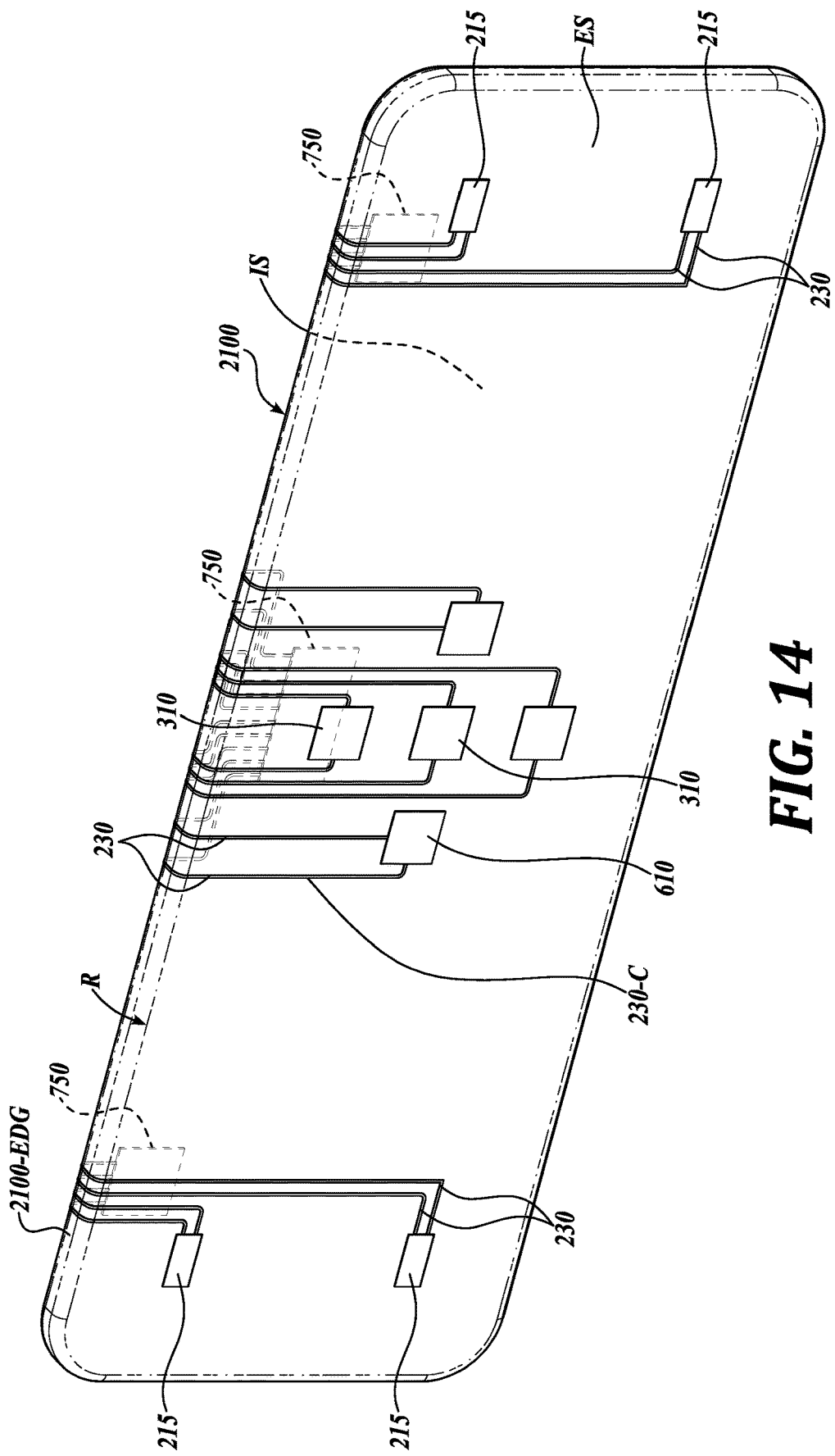
FIG. 14 is an isometric view of a panel in accordance with an embodiment of the presently disclosed technology.
Figure 14B:
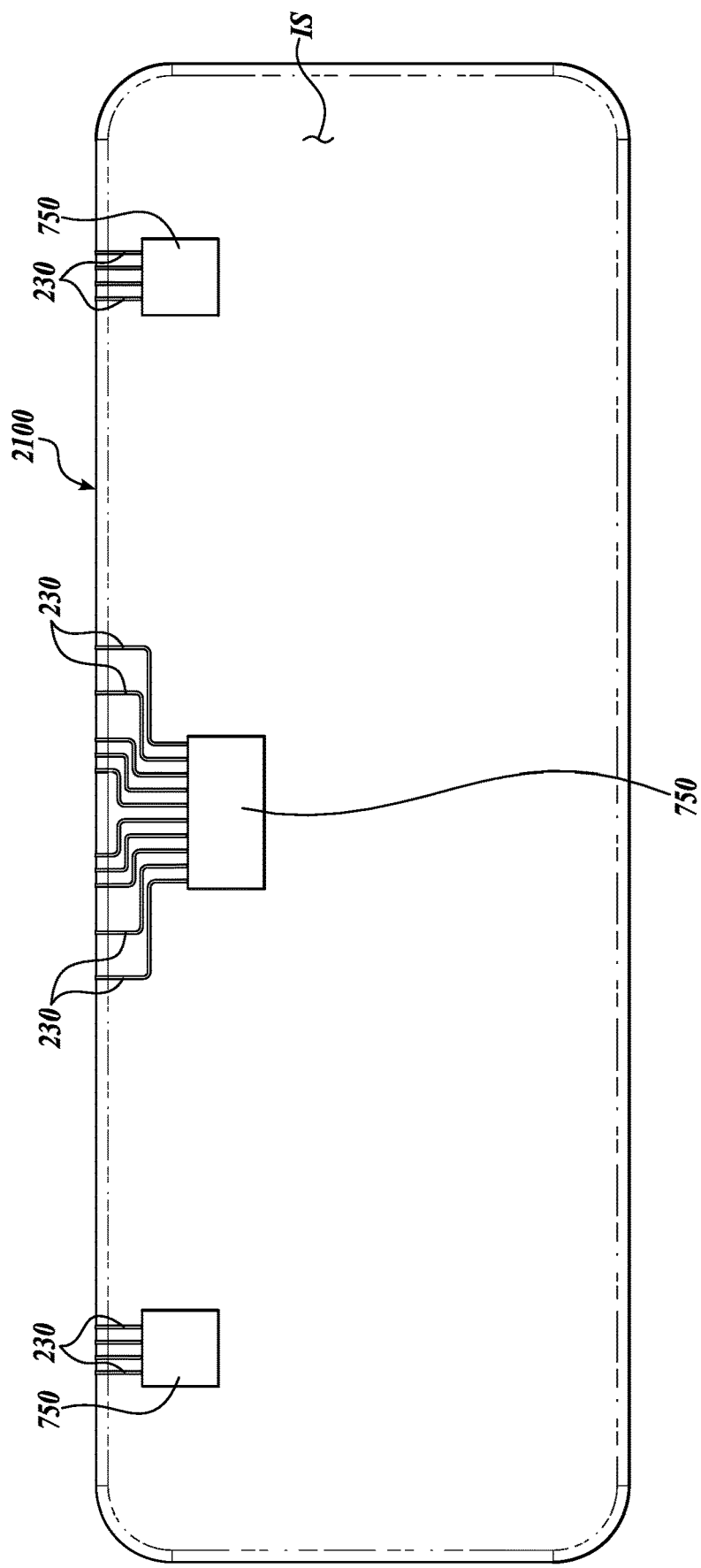

FIG. 14 is an isometric view of the panel 2100 in accordance with an embodiment of the presently disclosed technology. FIGS. 14A and 14B plan front and plan back views of the aerodynamic structure shown in FIG. 14.

In some embodiments, the panel 2100 carries the sensors, antennae, and/or actuators at the external surface ES. Some examples of such sensors and actuators are 3D-printed strain gauges 215, thermocouples 610, and heaters 310. Other sensors, devices, and/or actuators are possible in different embodiments. In operation, the ES faces the outside environment (which may be interior of the structure 3000, as explained above), thus exposing the sensors and actuators to the outside environment.

The internal surface IS faces the exterior of the aircraft structure 3000, where, in general, the environment is less harsh and/or subject to smaller oscillations in pressure, temperature, force, precipitation, etc. In some embodiments, the IS carries the electronic components or assemblies 750 (e.g., controllers, power supplies, processors, etc.).

In order to connect the sensors, actuators, antennas and other devices at the ES with the electronic components at the IS, electrical interconnects (e.g., traces 230) may be 3D-printed along the ES, turned over an edge 2100-EDG of the panel (e.g., through the double turn or fold), and routed further to the IS. In some embodiments, the edge 2100-EDG includes a fillet radius R that smooths the surface and removes the sharp edges, thus improving the integrity and reliability of the traces. For example, in some embodiments the fillet radius of about 600 µm or larger provides a relatively smooth surface that promotes better wetting and attachment of printable inks or materials.

In some embodiments, the electrically conductive traces 230 are encapsulated with polymer coatings (e.g., polyimide, polyurethane, or epoxies) or ceramic coatings (e.g. aluminum oxides) 230-C for electrical insulation from electrically conductive substrates (e.g. aluminum or carbon-based composites), environmental protection, and durability. These coatings may reduce fretting and other wear mechanisms during assembly and operation of the panel 2100.

Figure 15:
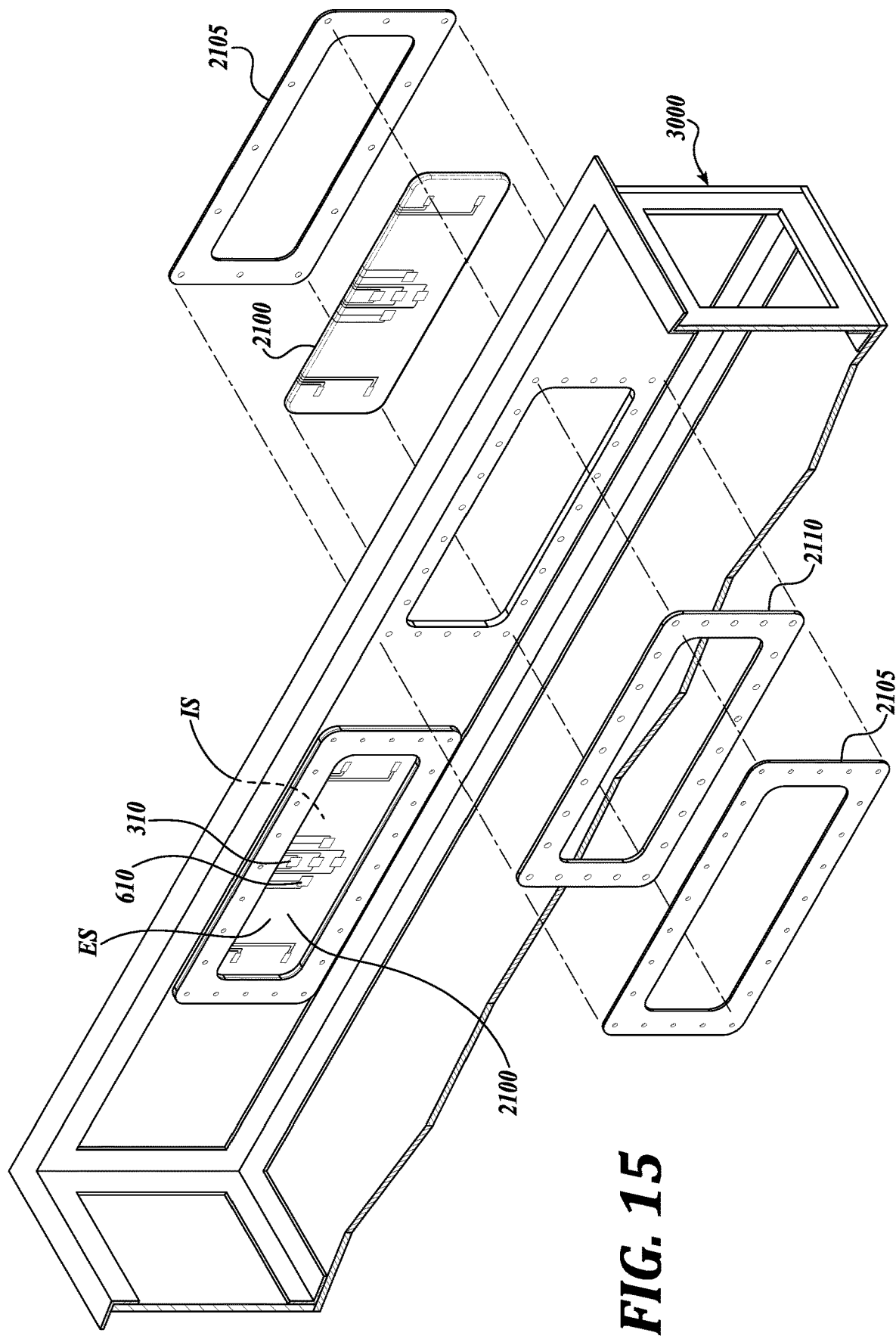
FIG. 15 is an exploded view of a panel and a wind tunnel in accordance with an embodiment of the presently disclosed technology.

FIG. 15 is an exploded view of the panel 2100 and the aircraft structure 3000 in accordance with an embodiment of the presently disclosed technology. In some embodiments, the panel 2100 may be a pre-manufactured or 3D-printed polycarbonate window that uses a seal 2110 (e.g., a polyurethane seal) for sealing. In some embodiments, the panels may be brittle substrates (e.g., ceramics), glass, composites, metals, or other materials where drilling may be risky or not allowed at all.

In some embodiments, the panel 2100 and the seal 2110 may be kept in place by opposing frames 2105 (e.g., aluminum or other metal frames). In operation, the sensors/actuators face the inner cavity of the structure 3000, where the working conditions are replicated. The electronic components face away from the inner cavity of the structure 3000, therefore being exposed to a less harsh environment. In some embodiments the panels (e.g., a canopy, a window, a windshield, or lens) that are instrumented with sensors, actuators, antennae, electronics, etc., may be integrated with the aerodynamic structure or apparatus, as explained in conjunction with FIGS. 16-17A below.

Figure 16:
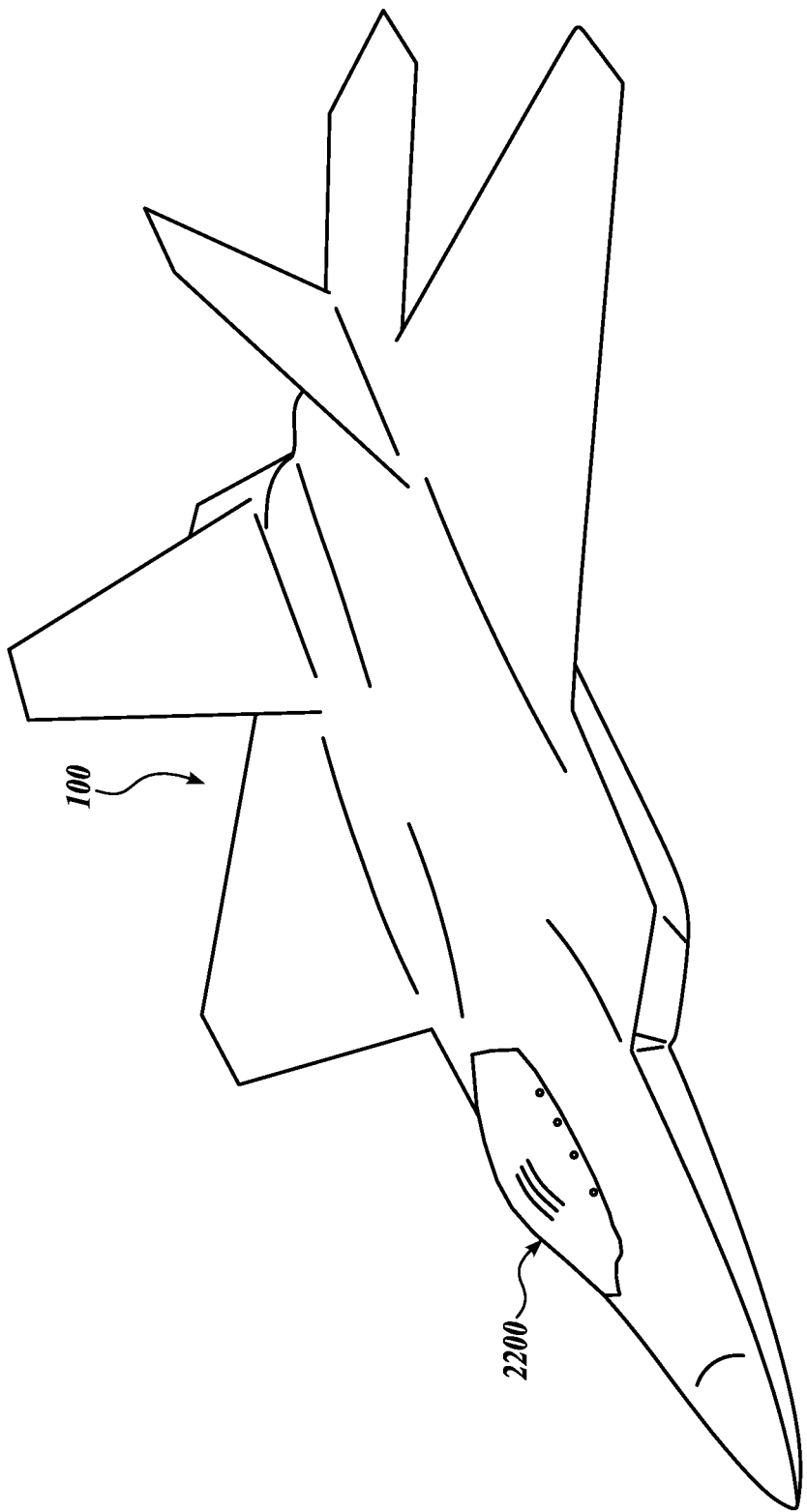
FIG. 16 is an isometric view of an aircraft having a canopy in accordance with an embodiment of the presently disclosed technology.

FIG. 16 is an isometric view of an aircraft 100 having a canopy 2200 in accordance with an embodiment of the presently disclosed technology. In operation, the canopy 2200 protects the pilot and sensitive electronics against the outside environment. In some embodiments, the canopy may be made of glass, plastics (e.g. polycarbonate), or ceramics. As a result, drilling holes in the canopy 2200 may be difficult and/or not allowed. In some embodiments, the sensors, actuators, antennae, and/or transducers (collectively referred to as 3D-printed components) may be 3D-printed on the outer surface ES of the canopy 2200, and electrically connected with the electronic components 750 on the inner side IS of the canopy, as explained below in conjunction with FIGS. 17 and 17A.

FIG. 17 is an isometric view of a canopy in accordance with an embodiment of the presently disclosed technology. FIG. 17A is a cross-sectional view of the canopy shown in FIG. 17. The illustrated canopy 2200 carries the sensors and actuators on its external surface ES. These sensors and actuators may be electrically connected through the traces 230 with the electronic components 750. In operation, the traces 230 provide an electrical path for the signal/power exchange between the ES and the IS. As a result, drilling through the canopy 2200 may be avoided.

In some embodiments, the edge of the canopy 2200 may be rounded as explained with respect to the panels 2100. In different embodiments, the inventive technology may be used to 3D-print the sensors, actuators, traces, and/or electronics on the aerodynamic structures such as wings, blades, propellers, engine components, prosthesis, aircraft, unmanned air vehicles, windshields, goggles, lenses, camera lenses, and glasses.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. For example, ice protection systems can be printed next to temperature sensor arrays for de-icing/anti-icing. In some embodiments, the pSKIN-based control of the aerodynamics/hydrodynamics of the vehicles may result in improved performance of the vehicles. Accordingly, the disclosure can encompass other embodiments not expressly shown or described herein.

I claim:

1. An aerodynamics apparatus, comprising:
    an aerodynamic structure having a first surface (ES) exposed to an outside environment (OE), and a second surface (IS) exposed to an inside environment (IE); and
    a printed sensor carried by the first surface (ES) of the aerodynamic structure;
    electronics carried by the second surface (IS) of the aerodynamic structure; and
    at least one printed conductive trace carried by the first surface (ES) and the second surface (IS), wherein the at least one printed conductive trace electrically connects the printed sensor with the electronics.

2. The apparatus of claim 1, wherein the aerodynamic structure is a first aerodynamic structure, the apparatus further comprising:
    a second aerodynamic structure connected with the first aerodynamic structure, wherein the at least one printed conductive trace is at least partially routed within a spacing between the first aerodynamic structure and the second aerodynamic structure.

3. The apparatus of claim 2, wherein the at least one printed conductive trace is a first printed conductive trace, the apparatus further comprising:
    a third aerodynamic structure connected with the first aerodynamic structure; and
    a second printed conductive trace that is at least partially routed within a spacing between the first aerodynamic structure and the third aerodynamic structure.

4. The apparatus of claim 3, further comprising at least one printed element selected from a group consisting of a printed actuator, an antenna, a transducer, and a functional coating, wherein the second printed conductive trace is electrically connected to the at least one printed element.

5. The apparatus of claim 1, wherein the aerodynamic structure includes at least one via connecting the first surface (ES) and the second surface (IE) of the aerodynamic structure, and wherein the at least one via includes an electrically conductive element that electrically connects the printed sensor on the first surface (ES) with the electronics on the second surface (IE).

6. The apparatus of claim 5, wherein the electrically conductive element is an electrically conductive pin.

7. The apparatus of claim 5, wherein the electrically conductive element is a 3D-printed trace.

8. The apparatus of claim 1, wherein the aerodynamic structure is a canopy of an airplane.

9. The apparatus of claim 1, wherein the aerodynamic structure is a window panel.

10. The apparatus of claim 1, wherein the aerodynamic structure is an aircraft structure.

11. The apparatus of claim 10, wherein the aircraft structure is an element of an unmanned airplane.

12. The apparatus of claim 1, wherein the aerodynamic structure is an element of a pump, a wind turbine, an air fan, a submarine, a ship, an engine, a prosthetics, a windshield, a car, a helmet, a goggle or glasses.

13. A method of instrumenting an aerodynamic structure, comprising:
    providing the aerodynamic structure having a first surface (ES) and a second surface (IS) opposite from the first surface;
    printing a sensor over the first surface (ES);
    adding electronic components to the second surface (IS); and
    printing conductive traces over the first surface (ES) and the second surface (IS), wherein the conductive traces electrically connect the sensor with the electronic components;
    wherein the first surface (ES) is exposed to an outside environment (OE), and the second surface (IS) is exposed to an inside environment (IE).

14. The method of claim 13, further comprising:
    printing at least one printed element selected from a group consisting of a printed actuator, an antenna, a transducer, and a functional coating over the first surface (ES) of the aerodynamic structure; and
    electrically connecting the actuator to the electronic components with the printed conductive traces.

15. The method of claim 14, further comprising:
    printing the sensor and the actuator over a foil by an electronics printer using additive manufacturing; and
    adhering the foil to the first surface (ES) of the aerodynamic structure.

16. The method of claim 13, wherein the aerodynamic structure is an element of a pump, a wind turbine, an air fan, a submarine, a ship, an engine, a prosthetics, a windshield, a car, a helmet, a goggle or glasses.

17. The method of claim 14, wherein the sensor is selected from a group consisting of a pressure sensor, a temperature sensor, a heat flux sensor, a strain sensor, an ice sensor, a strain transducer, and an RF antenna; and the actuator is selected from a group consisting of a heater, a piezoelectric transducer, a functional coating, an ionic actuator, a plasma actuator, and a miniature air blower.

18. The method of claim 14, wherein the aerodynamic structure is a canopy of an airplane.

19. The method of claim 14, wherein the aerodynamic structure is a first aerodynamic structure, the method further comprising:
    connecting a second aerodynamic structure with the first aerodynamic structure, wherein the at least one printed conductive trace is at least partially routed within a spacing between the first aerodynamic structure and the second aerodynamic structure.

20. The method of claim 14, further comprising:

forming at least one via in the aerodynamic structure, wherein the at least one via connects the first surface (ES) and the second surface (IS) of the aerodynamic structure; and placing an electrically conductive element inside the at least one via, wherein the electrically conductive element electrically connects the printed sensor on the first surface (ES) with the electronic components on the second surface (IS).

21. The method of claim 13, wherein the aerodynamic structure is an element of an unmanned aircraft.

* * * * *